(12) United States Patent
Eto et al.

(10) Patent No.: US 12,573,601 B2
(45) Date of Patent: Mar. 10, 2026

(54) PLASMA PROCESSING APPARATUS AND PLASMA PROCESSING METHOD

(71) Applicant: HITACHI HIGH-TECH CORPORATION, Tokyo (JP)

(72) Inventors: Soichiro Eto, Tokyo (JP); Tsubasa Okamoto, Tokyo (JP); Shigeru Nakamoto, Tokyo (JP); Tatehito Usui, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 17/911,779

(22) PCT Filed: Mar. 15, 2021

(86) PCT No.: PCT/JP2021/010341
§ 371 (c)(1),
(2) Date: Sep. 15, 2022

(87) PCT Pub. No.: WO2022/195662
PCT Pub. Date: Sep. 22, 2022

(65) Prior Publication Data
US 2024/0213004 A1 Jun. 27, 2024

(51) Int. Cl.
*H01J 37/32* (2006.01)
*H01L 21/3065* (2006.01)

(52) U.S. Cl.
CPC .... *H01J 37/32972* (2013.01); *H01L 21/3065* (2013.01); *H01J 2237/334* (2013.01)

(58) Field of Classification Search
CPC ......... H01L 21/00–86; H01J 37/00–36; H05H 1/00–54
See application file for complete search history.

(56) References Cited

U.S. PATENT DOCUMENTS 6,153,115 A * 11/2000 Le ........................... G01N 21/73
216/60
6,160,621 A 12/2000 Perry et al.
(Continued)

FOREIGN PATENT DOCUMENTS

JP H11-260799 A 9/1999
JP 2004-507070 A 3/2004
(Continued)

OTHER PUBLICATIONS

Principal Component Analysis—Wikipedia (Year: 2025).*
(Continued)

*Primary Examiner* — Joshua L Allen
*Assistant Examiner* — Andrew Keelan Laobak
(74) *Attorney, Agent, or Firm* — Miles & Stockbridge, P.C.

(57) ABSTRACT

A plasma processing apparatus and method in which light with a plurality of wavelengths from a surface of a wafer at a plurality of predetermined times during processing for the wafer as the processing target is received, and when a processing amount is detected by using a result acquired by comparing data indicating intensities of the received light with the plurality of wavelengths with comparative data acquired in advance and indicating intensities of the light with the plurality of wavelengths, a similarity in wafers is quantified based on the data indicating the intensities of the light with the plurality of wavelengths of light, and the processing amount is detected by comparing at least one piece of data selected according to the quantified similarity with the data indicating the intensities of the light with the plurality of wavelengths acquired during the processing for the plurality of wafers.

6 Claims, 13 Drawing Sheets

(56)     References Cited

U.S. PATENT DOCUMENTS

| | | | | |
|---|---|---|---|---|
| 10,453,695 B2 * | 10/2019 | Eto | ..................... | H01L 21/3065 |
| 2011/0315661 A1 | 12/2011 | Morisawa et al. | | |
| 2012/0288969 A1 | 11/2012 | Nakao et al. | | |
| 2014/0022540 A1 | 1/2014 | Asakura et al. | | |
| 2014/0262029 A1 | 9/2014 | Asakura et al. | | |
| 2014/0295583 A1 | 10/2014 | Nakamoto et al. | | |
| 2016/0351405 A1 * | 12/2016 | Fukuchi | ............ | H01J 37/32009 |
| 2017/0178874 A1 * | 6/2017 | Kawaguchi | ....... | H01J 37/32935 |
| 2018/0277377 A1 * | 9/2018 | Eto | ................... | H01J 37/32009 |
| 2020/0005140 A1 * | 1/2020 | Cherian | ................ | G06N 3/045 |

FOREIGN PATENT DOCUMENTS

| | | | |
|---|---|---|---|
| JP | 2010-219263 A | 9/2010 |
| JP | 2012-238734 A | 12/2012 |
| JP | 2014-022621 A | 2/2014 |
| JP | 2014-179474 A | 9/2014 |
| JP | 2014-195005 A | 10/2014 |
| JP | 2018-157120 A | 10/2018 |
| TW | 201436030 A | 9/2014 |
| TW | 201841189 A | 11/2018 |

OTHER PUBLICATIONS

Search Report mailed Jun. 1, 2021 in International Application No. PCT/JP2021/010341.
Written Opinion mailed Jun. 1, 2021 in International Application No. PCT/JP2021/010341.
Office Action mailed Mar. 1, 2023 in Taiwanese Application No. 111109185.

* cited by examiner

BEFORE PROCESSING          AFTER PROCESSING

MASK

FILM TO BE
PROCESSED

BASE FILM

SUBSTRATE

SMALL MASK
FILM THICKNESS

AVERAGE MASK
FILM THICKNESS

LARGE MASK
FILM THICKNESS

[FIG. 8]
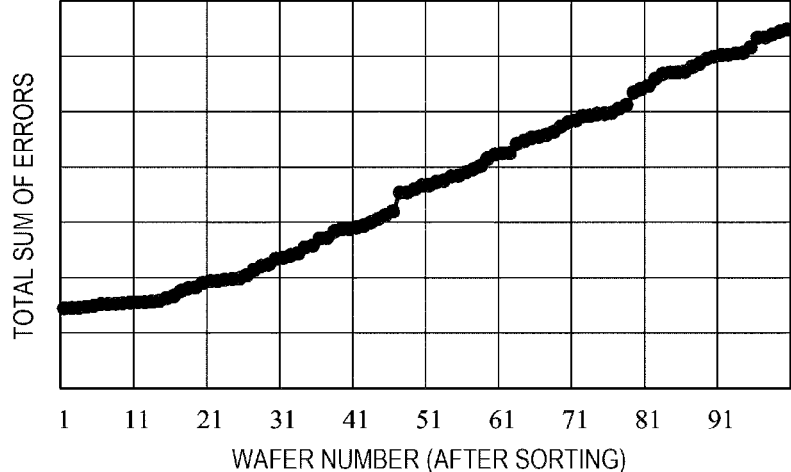
[FIG. 9]
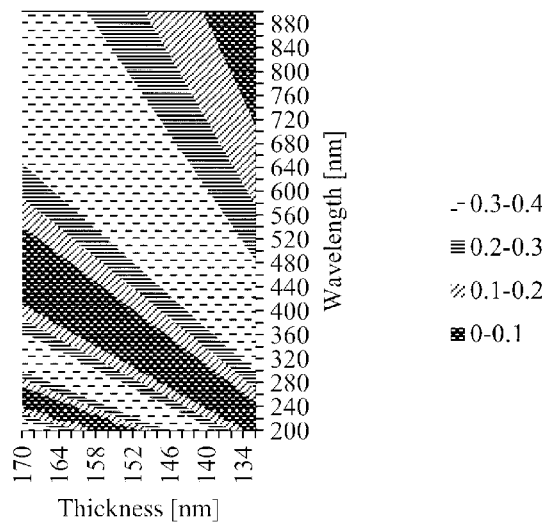

[FIG. 10]
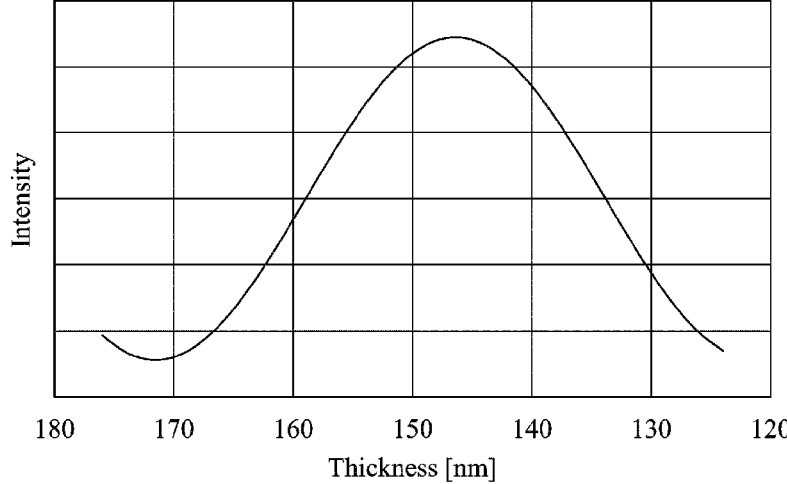
[FIG. 11]
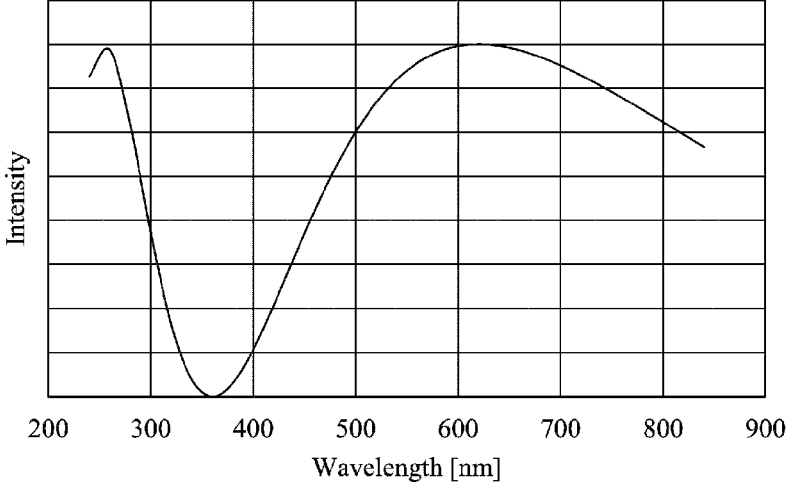

[FIG. 13]
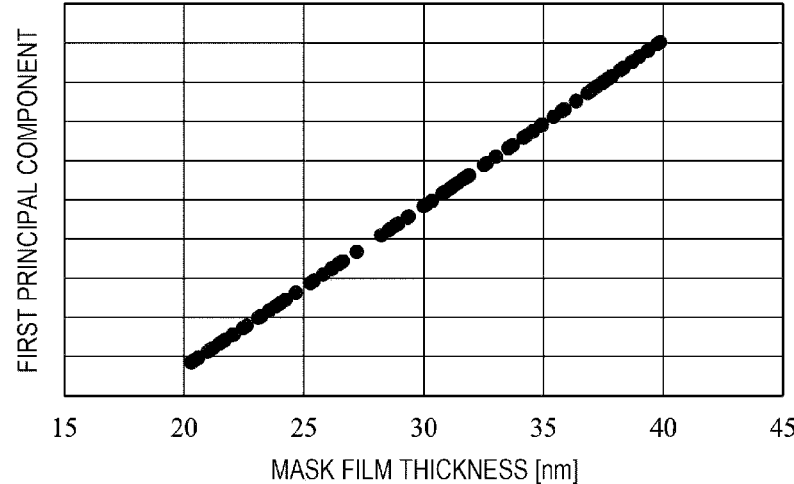
[FIG. 14]
| NUMBER OF WAFER WHOSE FILM THICKNESS IS TO BE DETECTED | DATABASE WAFER NUMBER | | | | | |
|---|---|---|---|---|---|---|
| | w1 | w2 | ... | w5 | ... | wn |
| w1 | 0 | 0.1 | ... | 1.2 | ... | 10 |
| w2 | 0.1 | 0 | ... | 0.8 | ... | 10 |
| w3 | 0.4 | 0.1 | ... | 0.4 | ... | 9 |
| w4 | 0.8 | 0.4 | ... | 0.1 | ... | 8 |
| w5 | 1.2 | 0.8 | ... | 0 | ... | 8 |
| ... | ... | ... | ... | ... | ... | ... |
| wn-2 | 10 | 9 | ... | 7 | ... | 0.4 |
| wn-1 | 10 | 10 | ... | 8 | ... | 0.1 |
| wn | 10 | 10 | ... | 8 | ... | 0 |
[FIG. 15]
| COMBINATION | DB1 | DB2 | DB3 | ... | DBn |
|---|---|---|---|---|---|
| #1 | wk1 | wl1 | wm1 | - | - |
| #2 | wk1 | wl1 | wm2 | - | - |
| #3 | wk1 | wl2 | wm2 | - | - |
| ... | ... | ... | ... | ... | ... |
| ... | ... | ... | ... | ... | ... |
| ... | ... | ... | ... | ... | ... |
| ... | ... | ... | ... | ... | ... |

[FIG. 16]
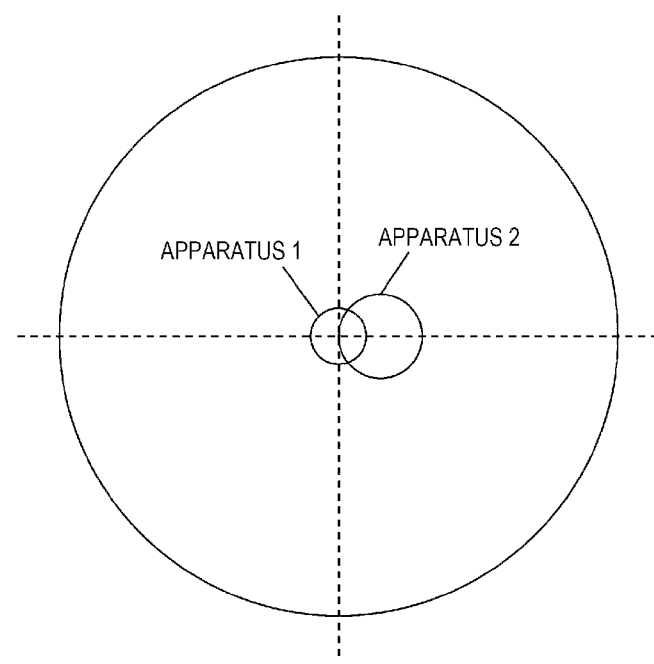
[FIG. 17]
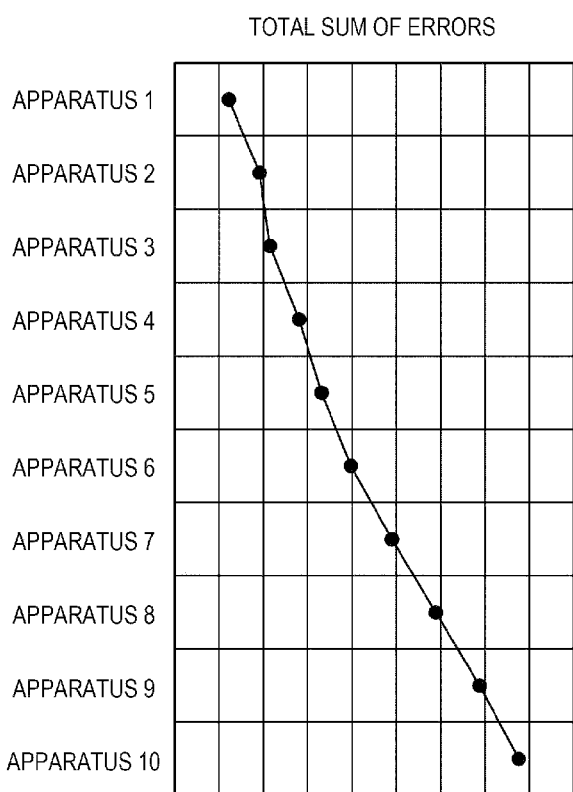

[FIG. 18]
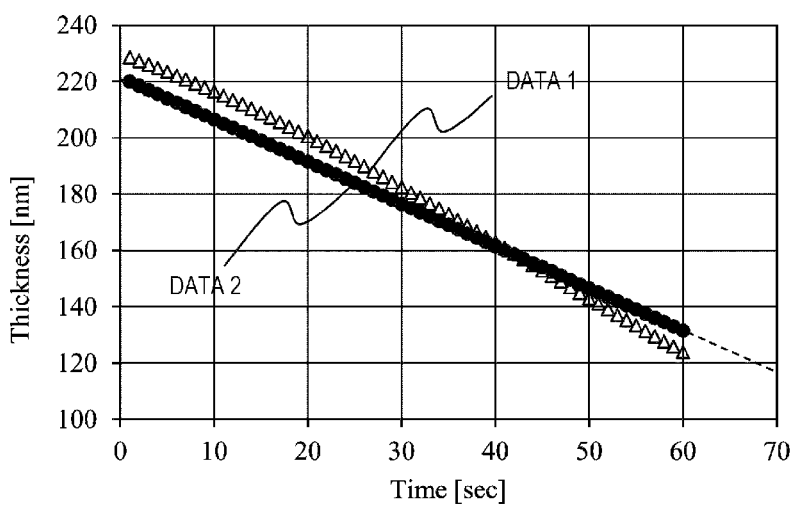
[FIG. 19]
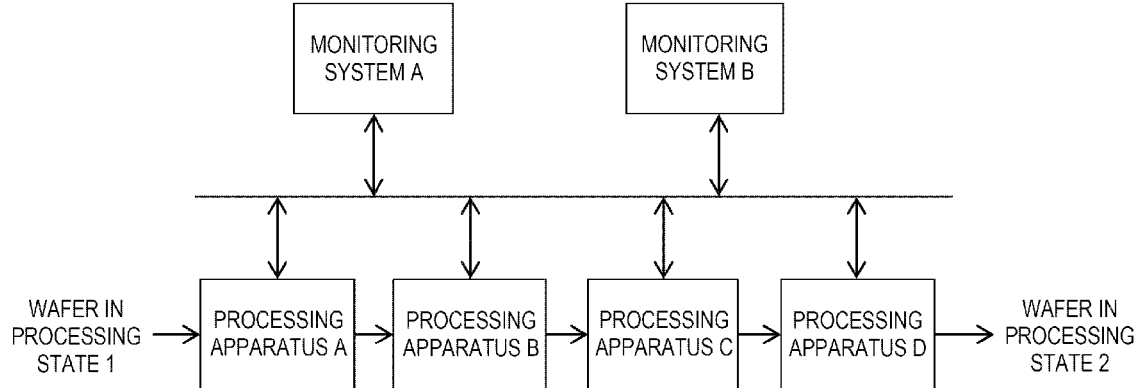

PLASMA PROCESSING APPARATUS AND PLASMA PROCESSING METHOD

TECHNICAL FIELD

The present invention relates to a plasma processing apparatus and a plasma processing method.

BACKGROUND ART

In manufacture of a semiconductor device, a step of forming a group of components in a circuit having various functions and a wiring for interconnecting the plurality of components is performed on a surface of a semiconductor wafer. These components and the wiring are formed by repeating a formation of film layers made of various materials which include a conductor, a semiconductor, or an insulator previously formed on a surface of a substrate-shaped sample such as a semiconductor wafer, and repeating processing such as removal of an unnecessary portion of these film layers. In the processing of removing such an unnecessary portion, dry etching processing (treatment) using plasma is widely used.

In such etching using the plasma (also called plasma etching), a processing gas is introduced into a processing chamber provided inside a vacuum vessel of a processing apparatus, and a high-frequency electric field generated by a high-frequency power supplied from a high-frequency power source is supplied to the processing chamber, atoms or molecules of the introduced gas are excited to be ionized or dissociated into plasma, and a surface of the sample is exposed to the plasma and brought into contact with the plasma to cause a reaction between particles in the plasma and a film layer of a processing target. In this case, anisotropic or isotropic etching for the film layer of the processing target is performed due to a physical reaction such as sputtering by charged particles such as ions in the plasma, or a chemical reaction with radicals (particles and active species having a reaction activity), or the like. On a wafer surface, such processing having different characteristics is appropriately selected and applied, and the wiring and the components which have a circuit structure implementing the above-described various functions are formed.

When a processed shape formed by the plasma etching is different from a design, the formed various components may not implement the functions thereof. Therefore, many process monitoring techniques for monitoring and stabilizing etching processing are proposed. For example, a process monitor configured to measure reflected light from a wafer during the processing to measure a film thickness of a film formed on the wafer or a depth of a groove or a hole formed on the wafer is called a film thickness or depth monitor, and is used to determine an end of the etching processing.

PTL 1 describes a method for improving a processing accuracy by using the film thickness or depth monitor. In this method, the film thickness or depth monitor using plasma light as a light source is used to detect etching processing immediately before a film of a processing target is completely removed, and the etching processing is ended. Then, by switching to a condition of selectively etching a portion to be processed and a portion not to be processed to perform the etching process, an overall processing time is shortened and the film to be processed is completely removed without a processing variation in a wafer surface.

PTL 2 describes a technique for improving an accuracy in measuring a film thickness or depth with a film thickness or depth monitor. In this method, an external light source is used instead of the plasma light as the light source to irradiate a wafer. Accordingly, a fluctuation in a light amount of the light source is reduced, and the film thickness or depth is measured with a high accuracy. The film thickness or depth monitor acquires a pattern of reflected light from the wafer acquired during etching as a database (referred to as DB) in advance, and compares the reflected light from the wafer measured during the etching with the DB to estimate a processing state of the wafer. Therefore, when a device structure of the wafer at a time of acquiring the DB is different from a device structure of a wafer as an evaluation target, there is a problem that the reflected light pattern of the DB does not match the reflected light pattern of the evaluation target, and the film thickness or depth cannot be accurately measured.

In response to such a problem, PTL 3 discloses a method for measuring a film thickness or depth in response to the above-described variation in the device structures between the wafers. In the technique in related art, when a film thickness of a base film of films to be etched is different for each of the wafers, the reflected light patterns of the wafers when the base film is thick and thin are acquired as DBs in advance, and by using these two DBs, the film thickness or depth can be accurately measured for wafers having the base films with various film thicknesses.

CITATION LIST

Patent Literature

PTL 1: JP-A-H11-260799
PTL 2: JP-T-2004-507070
PTL 3: JP-A-2014-195005

SUMMARY OF INVENTION

Technical Problem

However, the technique in related art in PTL 3 has the following problems.

That is, in PTL 3, when a structure of a film on an upper surface of the wafer is known, data on the patterns is used as a database (DB), the patterns using, as a parameter, a wavelength of an intensity of interference light due to the reflected light from the plurality of wafers having the base films in different thicknesses of the films to be etched, but when the film structure of the wafer is unknown, the film thickness or depth cannot be accurately measured.

For example, when a variation in a thickness and a shape of a film other than the films to be etched in the film structure presents in the plurality of wafers, a plurality of test wafers having a film structure equivalent to that of such wafers are processed in advance to obtain data on the interference light due to the reflected light as reference data in advance, and from the data, plural pieces of data regarding a processing depth or a residual film thickness during the processing of the wafer used for manufacturing a semiconductor device are appropriately selected as a DB used for determining an end of the etching process.

Meanwhile, when the film structure of the wafer is unknown, it is difficult to select appropriate data based on a difference in the structures between the wafers. For example, when detecting the residual film thickness or processing depth during the processing by using plural pieces of freely selected data, in a wafer having a structure different from the corresponding film structure, an accuracy is significantly reduced.

Therefore, there is a problem that if the data on the intensity of the interference light due to the reflected light corresponding to all variations generated in a shape, a size, a material, etc., of the film structure of the wafer is not acquired in advance, the residual film thickness or processing depth cannot be detected with a high accuracy by using a DB including such data. Such variations in the film structure include not only the thickness of the base film of the films to be etched, but also a structure including a size such as a thickness and width of a mask layer constituting the film structure, a shape and size of a film under the films to be etched, a width and pitch of a groove or a trench, and a shape and a size of a film layer around the films to be etched, and all factors that affect a relation between the residual film thickness or depth of the films to be etched and the intensity of the interference light due to the reflected light from the wafer are included.

A structure of a film on which the reflected light is generated may differ depending on a detection position or range of the reflected light on the wafer, and also in this case, similarly to the above, during the processing of the wafer having a film structure different from the film structure corresponding to the data, included in the DB, on the interference light due to the reflected light, there is a problem that the residual film thickness and the processing depth cannot be detected with a high accuracy by using the reflected light from the wafer. Even when a selection ratio of the etching processing of the films to be etched to etching processing of a peripheral material varies in each of the plurality of wafers, the intensity of the interference light due to the reflected light also varies. When reflected light data corresponding to a plurality of film structures having such a variation in the selection ratio is not used, similar to the above, the accuracy of detecting the residual film thickness or the processing depth during the processing is impaired.

When the wafer is irradiated with light from a light source provided outside a processing vessel to obtain reflected light from the wafer, the same problem as described above will occur if a spectrum of the light source varies or an intensity of plasma light formed in the processing vessel changes over time during the processing. A cause of this problem is not the film on the surface of the wafer but a fluctuation of light, and it is difficult to obtain a pattern of such fluctuation in advance. Therefore, even if the wafer is actually processed in advance and the reflected light data is acquired, a correlation between the fluctuation of the light and each of the plurality of wafers is small, and thus the data related to the reflected light cannot be properly selected, and the accuracy of detecting the residual film thickness or the processing depth corresponding to the fluctuations is impaired.

As described above, in the technique in related art, when sufficient information cannot be acquired about the film structure and the position or range, on the wafer, where the reflected light is detected, the variation in the selection ratio of an etching target to other materials, the spectrum of the light source, and a magnitude of the fluctuations in the plasma light changing over time, there is a problem that the data, corresponding to the variation and the fluctuations, on the reflected light from the wafer surface cannot be properly selected, and the accuracy of detecting a processing amount such as the residual film thickness or the processing depth is impaired by using the reflected light during the processing of the wafer.

An object of the invention is to provide a plasma processing apparatus or a plasma processing method capable of detecting a processing amount such as a residual film thickness of a film layer of a processing target during processing of a wafer with a high accuracy.

Solution to Problem

In order to solve the above problems, one of representative plasma processing apparatuses of the invention is a plasma processing apparatus that processes one or a plurality of wafers as one or more processing targets placed in a processing chamber inside a vacuum vessel by using plasma formed in the processing chamber, the plasma processing apparatus including: a receiver that receives light with a plurality of wavelengths from a surface of the one or each of the plurality of wafers at a plurality of predetermined times during processing of the one or the plurality of wafers as the one or more processing target; and a detector that detects a processing amount during the processing of the one or the plurality of wafers as the one or more processing targets by using a result acquired by comparing data indicating intensities of the received light with the plurality of wavelengths with comparative data acquired in advance and indicating the intensities of the light with the plurality of wavelengths, in which the detector quantifies a similarity in wafers based on the data acquired in advance during the processing of each of the plurality of wafers and indicating the intensities of the light with the plurality of wavelengths of light from the surface of each of the plurality of wafers, selects at least one piece of data based on the quantified similarity as the comparative data, and detects the processing amount by comparing with the data acquired during the processing of the one or the plurality of wafers as the one or the plurality of processing targets and indicating the intensities of the light with the plurality of wavelengths.

One of representative plasma processing methods of the invention is a plasma processing method for processing one or a plurality of wafers as one or more processing targets placed in a processing chamber inside a vacuum vessel by using plasma formed in the processing chamber, the plasma processing method including: a measuring step of receiving light with a plurality of wavelengths from a surface of the one or each of the plurality of wafers at a plurality of predetermined times during processing of the one or the plurality of wafers as the processing target; and a detecting step of detecting a processing amount at one of the plurality of predetermined time instants during the processing of the one or the plurality of wafers as the processing targets by using a result acquired by comparing an actual data indicating intensities of the received light with the plurality of wavelengths at the one of the plurality of predetermined time instants during the processing of the wafer with comparative data indicating the intensities of the light with the plurality of wavelengths from surfaces of at least three of wafers which are acquired in advance, in which the comparative data indicating the intensities of light from the surfaces of the at least three of wafers are selected from data obtained in advance indicating the intensities of the light with the plurality of wavelengths from the surface of a plurality of wafers during the processing of each of film structures on each of the plurality of wafers, and being correlated with a plurality of residual thicknesses of a target film in the film structure or time instants after the processing of the target film is started, the each of the plurality of wafers having a same type of the film structures laminated with the film layers made of same materials in vertical direction on the surface thereof and the comparative data being selected based on values of a similarity in each of the data indicating the intensities of the light with the plurality of wavelengths from the surfaces of the each of the plurality of wafers, and, in which in the detecting step, the processing amount at one of the plurality of predetermined time instants during the processing of the wafer is detected by determining the data in the comparative data having a minimum difference or deviation from the actual data indicating intensities of the received light with the plurality of wavelengths at the one of the plurality of predetermined time instants during the processing of the wafer.

Advantageous Effect

The invention can provide the plasma processing apparatus or the plasma processing method capable of detecting the processing amount such as the residual film thickness of the film layer of the processing target during the processing of the wafer with the high accuracy.

Problems, configurations, and effects other than those described above will be clarified with reference to the description of the following embodiments.

BRIEF DESCRIPTION OF DRAWINGS

FIG. 1A is an overall view thereof, and FIG. 1B shows a configuration of a film thickness or depth calculation unit.

FIG. 2A shows states before and after processing, and FIG. 2B shows states where a film thickness varies.

FIG. 3A shows a relation between a wavelength and a reflection intensity, and FIG. 3B shows a result of detecting a film thickness or depth during the processing of the plurality of wafers and determining an end.

FIG. 4A shows a map, and FIG. 3B shows a film thickness spectrum.

FIG. 5A shows a relation between a light intensity and the wavelength, FIG. 5B shows a relation between an error and the wavelength, and FIG. 5C shows a relation between a total sum of errors and a mask film thickness.

FIG. 6A shows a relation between the total sum of errors and a wafer number, and FIG. 6B shows a relation between a thickness of a processed film and the number of processed wafers.

FIG. 7A shows a relation between a light intensity and a thickness, and FIG. 7B shows a relation between a total sum of errors and a mask film thickness.

FIG. 8 is a graph showing, for each of wafer numbers, a value of the total sum of errors of reflected light data acquired during the processing in which the modification according to FIGS. 7A and 7B processes the plurality of wafers having the film structure shown in FIGS. 2A and 2B.

FIG. 9 is a graph showing, as a map, a relation of a residual film thickness during processing, and a pattern, with the plurality of wavelengths as parameters, of the values of the intensities of the reflected light from the wafer, in which the processing is etching processing performed on the wafer having the film structure shown in FIGS. 2A and 2B by another modification of the plasma processing apparatus according to the embodiment shown in FIGS. 1A and 1B.

FIG. 10 is a graph showing an example of a change in a value of a first derivative in an intensity of light with a specific wavelength with respect to a change in a residual film thickness of a film of a processing target acquired during processing, in which the processing is etching processing performed on the wafer having the film structure shown in FIGS. 2A and 2B by another modification of the plasma processing apparatus according to the embodiment shown in FIGS. 1A and 1B.

FIG. 11 is a graph showing an example of intensities of reflected light having a plurality of wavelengths when a film of a processing target acquired during processing has a predetermined residual film thickness, in which the processing is etching processing performed on the wafer having the film structure shown in FIGS. 2A and 2B by another modification of the plasma processing apparatus according to the embodiment shown in FIGS. 1A and 1B.

FIG. 12A shows a relation between the first principal component and the mask film thickness, and FIG. 12B shows a relation between the second principal component and the mask film thickness.

FIG. 13 is a graph showing an example of a relation between the initial thickness of the mask layer of each of the wafers and a maximum value of a dispersion of a distance between data acquired by using Isometric Mapping on the plural pieces of light intensity data on the reflected light from the film structure on the wafer surface acquired during processing, in which the processing is etching processing performed on the plurality of wafers having the film structure shown in FIGS. 2A and 2B by another modification of the plasma processing apparatus according to the embodiment shown in FIGS. 1A and 1B.

FIG. 14 is a table showing an example of a data table whose component is a value of an error of a predetermined residual film thickness of another wafer detected by using each of the plural pieces of light intensity data on the reflected light from the film structure on the wafer surface acquired during processing, in which the processing is etching processing performed on the plurality of wafers having the film structure shown in FIGS. 2A and 2B by another modification of the plasma processing apparatus according to the embodiment shown in FIGS. 1A and 1B.

FIG. 15 is a table showing a combination of wafers in a database in which residual film thicknesses of n wafers selected from a data table according to the another modification of the embodiment of the invention shown in FIG. 14 can be detected.

FIG. 16 is a top view schematically showing a position on a wafer surface where reflected light from a wafer is detected when the plasma processing apparatus according to another modification of the embodiment shown in FIGS. 1A and 1B performing the etching processing on the plurality of wafers having the film structure shown in FIGS. 2A and 2B.

FIG. 17 is a graph showing, for each of a plurality of plasma processing apparatuses, a total sum of errors of a predetermined residual film thickness of another wafer detected by using the plural pieces of light intensity data on the reflected light from the film structure on the wafer surface acquired during processing, in which the processing is etching processing performed on the plurality of wafers having the film structure shown in FIGS. 2A and 2B by another modification of the plasma processing apparatus according to the embodiment shown in FIGS. 1A and 1B.

FIG. 18 is a graph showing an example of a change over time, detected by using the reflected light from the wafer during processing, in the residual film thickness of the film layer of the processing target on the wafer, in which the processing is to etch the wafer having the film structure shown in FIGS. 2A and 2B by the plasma processing apparatus according to another modification of the embodiment shown in FIGS. 1A and 1B.

FIG. 19 is a block diagram schematically showing an outline of a configuration of a system for monitoring the plasma processing apparatus according to the embodiment shown in FIGS. 1A and 1B.

DESCRIPTION OF EMBODIMENTS

Outline of Embodiment

Figure 1A:
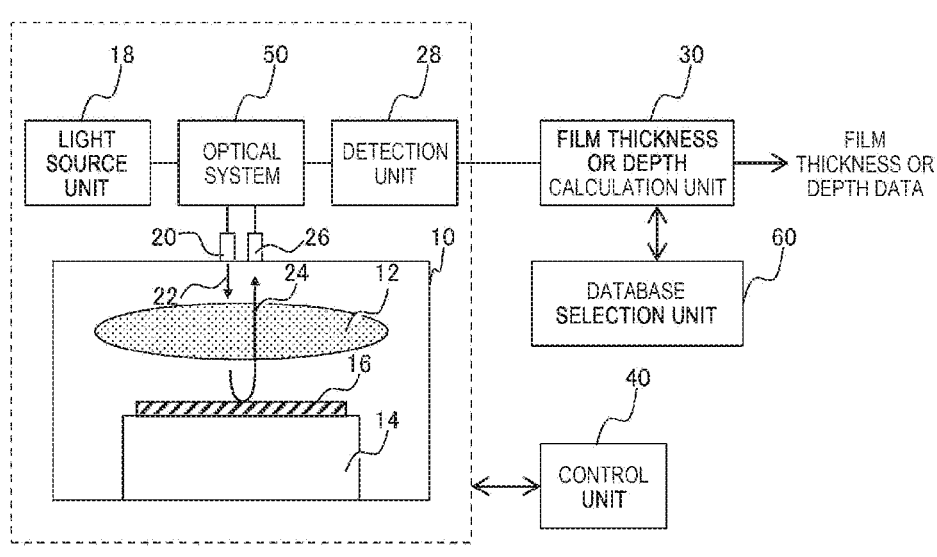
FIGS. 1A and 1B are diagrams schematically showing an outline of a configuration of a plasma processing apparatus according to an embodiment of the invention, where

In an embodiment of a plasma processing method or a plasma processing apparatus of the invention described below, data indicating an intensity of reflected light or a change of the intensity is acquired from a wafer surface when a plurality of wafers are subjected to processing such as etching, and a similarity in the wafers is calculated as a numerical value based on the intensity data on the reflected light from each of the wafers. The calculated similarity values are used, and plural pieces of data related to the light intensity and a residual film thickness or processing depth with a wavelength of the light from the wafer as a parameter are selected or calculated, and the pieces of data are used to detect the residual film thickness or depth during the processing.

The plurality of wafers, in which data on the reflected light from the surface of each of the wafers is acquired, may be a plurality of (two or more) wafers in the same processing step, for example, wafers (product wafers) subjected to a step of mass-producing a semiconductor device to be a product are preferably used. Instead of using the product wafers, a test wafer that is processed under the same conditions as those for processing the product wafers may be used for the purpose of acquiring the reflected light data. Alternatively, data based on a simulation, in which the reflected light during the processing step is reproduced, particularly a variation in the reflected light from the wafer generated during the processing is reproduced, may be used.

The reflected light data uses a group of plural pieces of data (data set) indicating values of the intensity of the reflected light from the wafer surface during the processing with passage of time. For example, the reflected light from the wafer during the etching is divided into a plurality of predetermined wavelengths at each time, and so-called time-series data in which a signal indicating a light intensity detected for each of the wavelengths is related to each time may be used as the reflected light data. The data indicating a change over time, acquired at each time, in the value of the light intensity for each of the predetermined wavelengths or a predetermined range of wavelengths may be used as the reflected light data.

The data used for calculating the similarity in the wafers may be at least an index showing the light intensity that reflects the residual film thickness or depth of the film to be etched. For example, as the data, a value of a light amount of the reflected light from the surface of the wafer including a film layer of a detected target, or data in which noise and offset superimposed by performing digital signal processing on the light amount are removed or reduced and corrected. When a magnification of the light intensity or an etching rate fluctuates for each of the plurality of wafers, the data may be a result of standardizing the light amount acquired based on a specific light amount.

An index indicating the light intensity may be data formatted in a format capable of comparing differences in the plurality of wafers. For example, when a range of values of the residual film thicknesses and the etching rates during the etching processing are different in the plurality of wafers, times when light amounts of the wafers are detected are converted into the residual film thicknesses, and light amount data may be used as an index indicating the light intensity in a range where the residual film thicknesses of the wafers are the same. When the number of pieces of data of the film thicknesses detected during the processing of the wafers (the number of time points during the processing in which the detection is performed) are different, the data acquired by interpolation processing such as spline complementation may be used for point interpolation and resampling processing, and a value equivalent to the number of pieces of data may be used as an index indicating the light intensity.

When a wavelength range or the number of the wavelengths of the acquired reflected light is different in the wafers, the same processing as processing when the film thicknesses are different can be performed. The index showing the light intensity may use not only so-called two-dimensional data in which the film thickness and the wavelength are parameters, but also one-dimensional data in which data on a specific residual film thickness or data on a specific wavelength is extracted.

Calculation of the similarity in the wafers, using the intensity of the light reflected from the surface acquired during the processing of the wafers, is performed by calculating a value of a difference in the light intensities of the wafers. For example, an average value of the light intensities indicated by the two-dimensional or one-dimensional data acquired for all the wafers which are similarity calculating targets is calculated, an error absolute value or a squared error between the data on the light intensities of the wafers and the average light intensity is calculated, and a sum of these values may be used as the index of the similarity. Alternatively, a cosine similarity of the light intensity of the reflected light acquired from the wafers to the average value of the light intensities may be used.

A principal component value acquired by principal component analysis of the data on the light intensities of all the wafers may be used as an index of the similarity. Further, a value acquired by applying a dimension reduction method to the data on the light intensities of all the wafers may be used. Specifically, Isomap, LLE, Laplacian Eigenmaps, Hessian Eigenmaps, spectrum clustering, a diffusion map, kernel PCA, and the like can be used.

The plural pieces of data selected or calculated based on the values indicating the calculated similarities are acquired from the plurality of (two or more) wafers with different values of the similarities, and are selected to include wafers near a minimum and maximum of a particular axis of quantified results. For example, the data may be extracted, at approximately equal intervals on a digitization axis, from the wafers having numerical values containing a minimum and maximum of the digitization axis and sandwiched between the minimum and maximum.

By setting the wafers as DBs and estimating the film thickness for another wafer, a wafer range in which the film thickness or depth can be measured in the DBs of the wafers is calculated, wafer combinations in which the film thicknesses or depths of all the wafers can be measured are determined, and the plurality of DBs may be selected by using a combination with a minimum number of wafers among the determined wafer combinations.

Here, whether the film thickness or depth can be measured may be determined based on whether an error between an estimation result of the film thickness or depth and an actual measurement result is within an optional target error. The selection of the plurality of DBs from the determined wafer combinations may be made such that the number of wafers is the minimum and a total number of the wafers whose film thicknesses or depths can be measured is the maximum. When obvious abnormal wafer data is included, the wafer may be excluded from the determination of whether the film thickness or depth can be measured.

A method for specifying the film thickness or depth by using the plurality of DBs set by the above methods may be performed by comparing the reflected light data acquired from the wafer to be evaluated with the plurality of DBs. For example, the reflected light of the wafer to be evaluated is compared with the DBs, estimated values of the film thicknesses or depths in the DBs are calculated, and an estimated value of a film thickness or depth of a DB having a smallest matching error of the reflected light with the DBs may be the value of the film thickness or depth at a current time. The matching error is not limited to an error of the current time, but may be a sum including a past time.

The embodiment of the invention can acquire the reflected light data when the plurality of wafers are etched, quantify a similarity in the wafers based on the light intensity of the reflected light data of the wafers, select the plurality of DBs by using the quantified results of the similarity, and measure the film thickness or depth by using the selected DBs.

According to the embodiment of the invention, the plasma processing apparatus or a plasma processing method for processing the wafer as the processing target while detecting the residual film thickness or processing depth will be described with reference to the drawings. The present embodiment shows semiconductor manufacturing equipment that etches a wafer placed in a processing chamber inside a vacuum vessel and includes a portion configured to detect a residual film or processing depth during processing, and describes a step of detecting the residual film thickness or processing depth during the etching processing performed by the semiconductor manufacturing equipment.

First Embodiment

Figure 1B:
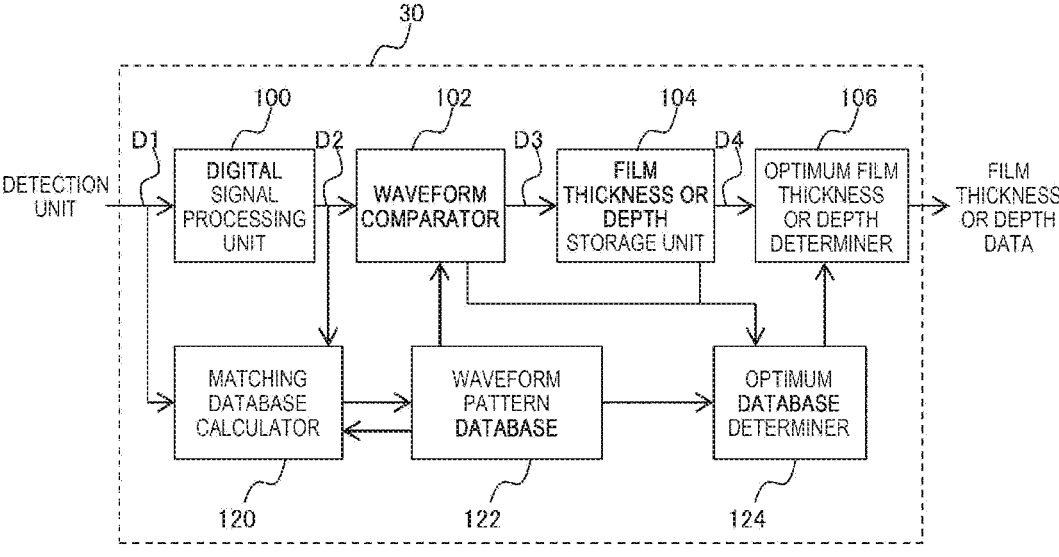

Hereinafter, an embodiment of the invention will be specifically described with reference to FIGS. 1A to 6B. FIGS. 1A and 1B are diagrams schematically showing an outline of a configuration of the plasma processing apparatus according to the embodiment of the invention. In particular, in FIG. 1A shows an outline of a vertical cross-sectional view of the plasma processing apparatus according to the present embodiment.

In the plasma processing apparatus shown in the drawing, an etching gas introduced from a gas introducing portion (not shown) inside a vacuum processing chamber 10 is excited and decomposed by electric power or microwave generated by using a high-frequency power source (not shown) to become plasma 12, and a processing target 16 such as a semiconductor wafer provided on a sample table 14 is etched (plasma-processed) by the plasma 12.

A control unit 40 introduces a gas into the vacuum processing chamber 10, generates and controls the plasma 12, applies a voltage to the processing target performed by a high-frequency power source (not shown), and the like, and synchronization and timing adjustment are performed between devices such that desired etching processing is implemented. When the plasma 12 is pulsed, the pulsing processing is also controlled by the control unit 40. In this case, the plasma 12 is switched on/off by the voltage application by the high-frequency power source or the like that turns the etching gas into the plasma, modulation such as microwave irradiation, and the plasma is pulsed. The plasma is also pulsed by time-modulating the introduction of the etching gas.

The plasma processing apparatus includes a mechanism for measuring a film thickness or depth of the processing target 16. Light emitted from a light source 18 is introduced into the vacuum processing chamber 10 via an optical system 50 and an introduction lens 20, and is applied to the processing target 16 as irradiation light 22. The light source unit 18 uses continuous spectrum light having a continuous wavelength from ultraviolet to infrared, but when measuring the film thickness or depth by using a specific wavelength, the light source having the specific wavelength may be used. Reflected light 24 from the processing target 16 is introduced into a detection unit 28 via a detection lens 26 and the optical system 50.

The detection unit 28 is configured with a spectroscope, disperses the introduced light, and detects a light amount for each wavelength. When measuring the film thickness or depth by using the specific wavelength, the detector is not limited to the spectroscope, and may use a photodetector or the like. In this case, when the light introduced into the detection unit 28 only has the desired specific wavelength, the photodetector may be used directly, and when the continuous spectrum light is introduced, a mechanism for selecting only a specific wavelength with a monochromator or the like may be provided in front of the photodetector.

Here, in FIG. 1A, the introduction lens 20 that introduces the light into the vacuum processing chamber 10 and the detection lens 26 that detects the reflected light are provided at different positions. In a case of this configuration, in order to most efficiently detect the reflected light 24, it is desirable to incline the introduction lens 20 and the detection lens 26 so as to face the same light beam with the processing target 16 as a reflection surface.

The configurations of the introduction lens 20 and the detection lens 26 are not limited to the configurations in FIG. 1A, and the introduction lens 20 and the detection lens 26 may be combined as one and shared as a completely coaxial configuration. In this case, it is desirable that light beam directions of the lenses are perpendicular to the processing target 16, and vertically reflected light acquired as a result of vertical irradiation can be detected. FIG. 1A shows a pair of systems of an introduction system for external light and a detection system for the reflected light 24, and when the film thickness or depth is measured at a plurality of positions of the processing target 16, a plurality of measurement systems may be disposed.

FIG. 1A shows a case where the light is emitted from the external light source unit 18 as the light source, and when light of the plasma 12 is used as the light source, the light source unit 18 may not be used. When the plasma 12 is used as the light source, the light emitted from the plasma 12 is reflected by the processing target 16, and the reflected light 24 is detected in the same manner as when the light source unit 18 is used. Data of the detection unit 28 is introduced into a film thickness or depth calculation unit 30 to determine the film thickness or depth.

The film thickness or depth calculation unit 30 is provided with a database used for determining the film thickness or depth from a database selection unit 60. When data on a plurality of wafers that can be database candidates presents, the database selection unit 60 quantifies a similarity of the candidates by comparing light intensities in the wafer data. For example, the similarity is quantified by using an error absolute value or a sum of squared errors from an average light intensity, a cosine similarity, principal component analysis, Isomap, LLE, Laplacian Eigenmaps, Hessian Eigenmaps, spectrum clustering, a diffusion map, a kernel PCA, or the like. The database is selected by using the quantified similarity of the wafers.

A configuration of the film thickness or depth calculation unit 30 will be described with reference to FIG. 1B. The present drawing is a block diagram that divides the configuration of the film thickness or depth calculation unit 30 shown in FIG. 1A into blocks for all the parts that implement functions, and shows an exchange and flow of data or information among the blocks with lines or arrows.

As shown in the drawing, time-series data D1 on light amounts of the wavelengths introduced from the detection unit 28 to the film thickness or depth calculation unit 30 is supplied to a waveform comparator 102 as time-series data D2 after various noises and fluctuations are removed and corrected by a digital signal processing unit 100. In signal processing in the digital signal processing unit 100, a low-pass filter is used to remove noise on a time axis of the wavelengths. As the low-pass filter, for example, a second-order Butterworth low-pass filter can be used, and the time-series data D2 can be acquired by the following Formula.

$$D2(i)=b1 \cdot D1(i)+b2 \cdot D1(i-1)+b3 \cdot D1(i-2)-[a2 \cdot D2(i-1)+a3 \cdot D2(i-2)]$$

Here, Dk(i) represents data at an optional sampling time i of data Dk, and coefficients a and b have different values depending on a sampling frequency and a cutoff frequency. Coefficient values of digital filters are, for example, a2=−

1.143, a3=0.4218, b1=0.067455, b2=−0.013491, b3=0.067455 (the sampling frequency is 10 Hz, and the cutoff frequency is 1 Hz).

When removing noise in a specific wavelength range of the data Dk indicating the light intensity acquired at each of sampling times, the data Dk may be filtered by passing the data Dk through the low-pass filter, or a Savitsky-Golay-method (S-G method) may be used. When removing the offsets of the light amounts of the wavelengths for the data Dk and detecting a change in the light amounts with passage of time (a change over time), the signal processing can be used to calculate a difference in light amounts (light intensities) in the data Dk(i) at the plurality of times i and a change rate (a differential value) in the light intensity at each of the times i. For example, the data Dk(i) acquired at the sampling times i and data at a predetermined number of sampling times before and after the sampling time i are used and the S-G method is applied to polynomialize and smooth the data Dk(i) to calculate the differential value, and then the time-series data D2 ($i$) on the differential value for each of the sampling times i can be acquired.

Such processing on data can be called a polynomial fitting smoothing differential method, which is given by the following Formula.

$$D3(i) = \sum_{j=-2}^{2} wj \cdot D2(i+j) \qquad \text{[Math. 1]}$$

Here, regarding a weighting factor wj, for example, w−2=−2, w−1=−1, w0=0, w1=1, and w2=2 are used in first-order differential calculation. In second-order differential calculation, for example, W−2=2, w−1=−1, w0=−2, w1=−1, w2=2 are used.

In the data Dk(i) on an optional sampling time, when the values of the light amounts of all the wavelengths to be detected in the data change at the same rate over time, processing can be applied to normalize the values of the light amounts of the wavelengths by an average value of the light amounts of all the wavelengths or a sum of absolute values.

In the present embodiment, the time-series data D2($i$) output from the digital signal processing unit 100 is received by the waveform comparator 102, and in the waveform comparator 102, a calculator is used to compare the time-series data D2($i$) with at least one piece of pattern data stored in a waveform pattern database 122 and showing a correlation between the film thickness or depth acquired in advance and the light amounts of the wavelengths. Here, the pattern means a spectrum pattern.

In the waveform comparator 102, the pattern data with a wavelength as a parameter, in which a plurality of values of the film thicknesses or processing depths or times after a start of the processing in the waveform pattern database 122 are associated with values of the light intensities of the plurality of wavelengths, is compared with the data D2 ($i$) at the sampling times i of the time-series data D2, and among the pattern data on the film thicknesses, or processing depths, or the light amounts (the light intensities) of the plurality of wavelengths at the times after the start of the processing, data with a smallest difference from the pattern of data D2 ($i$) is detected as closest pattern data.

As the pattern data with the smallest difference, for example, the data having a smallest standard deviation in the data on the plurality of wavelengths can be used. A film thickness or processing depth corresponding to the closest pattern data is calculated as a residual film thickness or processing depth at the sampling time i. The values of the residual film thickness or processing depth, calculated by the waveform comparator 102, at each of the sampling times i is transmitted to a film thickness or depth storage unit 104, and stored, as time-series data $D3(i)$, in a storage device such as a hard disk or a semiconductor RAM or a ROM that is connected to the film thickness or depth storage unit 104 so that the data can be communicated.

The data on the light amounts of the wavelengths in the waveform pattern database 122 is the data processed by the signal processing performed by the digital signal processing unit 100. Here, when the waveform pattern database 122 has a plurality of databases of pattern data on the film thickness or depth and the light amounts of the wavelengths, a film thickness or depth D3 determined by using the databases may be supplied to the film thickness or depth storage unit 104.

The film thickness or depth storage unit 104 supplies time-series data D4 on the film thickness or depth to an optimum film thickness or depth determiner 106.

The optimum film thickness or depth determiner 106 determines an optimum film thickness or depth by using data supplied from an optimum database determiner 124, and outputs the optimum film thickness or depth to an outside of the film thickness or depth calculation unit 30. For example, the film thickness or depth determined by a database number supplied from the optimum database determiner 124 is output from the optimum film thickness or depth determiner 106.

Here, the optimum database determiner 124 determines an optimum database by using the data supplied from the waveform comparator 102 and/or the film thickness or depth storage unit 104. For example, the closest pattern data in the databases supplied from the waveform comparator 102 and pattern data with a smallest difference as a result of performing pattern matching with a current pattern are determined as "optimal" data, and the "optimal" data is selected as pattern data used for detecting the residual film thickness or processing depth. In the selection of the pattern data, not only data on a light intensity acquired at a current time i during the processing, but also a total difference acquired as a result of performing the pattern matching with the data on the light intensity at a past time may be used. In this case, the pattern data having the smallest difference with respect to the pattern data, with the wavelengths as parameters, of the light intensities at a plurality of times including the past time is selected.

For example, the time-series data on the film thickness or depth of the databases supplied from the film thickness or depth storage unit 104 may be used to determine a database having a smallest correlation coefficient between the times and the film thickness or depth as an optimum database.

The waveform pattern database 122 may use a database containing plural pieces of data supplied from a matching database calculator 120. For example, in the matching database calculator 120, the time series data D1 and/or the time series data D2 and the data supplied from the waveform pattern database 122 are used to generate a database including pattern data that matches the pattern of the data indicating the light intensity acquired at the current time i or has the value of the difference in the result of performing the pattern matching within a predetermined allowable range, and the database is sent and supplied to the waveform pattern database 122. For example, a database generated based on predetermined calculation in the matching database calculator 120 may be supplied to the waveform pattern database 122. As a predetermined operation for calculating the database, a method for linearly interpolating two databases or calculation processing of interpolating two or more databases with a polynomial can be used.

In the film thickness or depth calculation unit 30 of FIG. 1B, not only when a plurality of databases are present in the waveform pattern database 122 but also when only one database is used, the residual film thickness or processing depth is detected from the intensity of the reflected light from the processing target 16 detected at the optional time i during the processing, and data indicating the residual film thickness or processing depth is output. When only one database stored in the waveform pattern database 122 presents, the matching database calculator 120 and the optimum database determiner 124 are not used, the data indicating the value of the film thickness or depth detected or calculated by the film thickness or depth storage unit 104 is output as it is from the film thickness or depth calculation unit 30.

The plasma processing apparatus shown in FIG. 1A determines an end by using a signal indicating the film thickness or depth output from the film thickness or depth calculation unit 30. That is, in an end determiner that receives the signal from the film thickness or depth calculation unit 30, when the value of the residual film thickness or processing depth indicated by the signal is compared with a predetermined value of a target film thickness or processing depth, if it is determined that the value of the residual film thickness or processing depth is within the predetermined allowable range, it is determined that the processing reaches an end, and if the value of the residual film thickness or processing depth is out of the allowable range, it is determined that the processing does not reach the end. When it is determined that the target residual film thickness or processing depth is reached, a notification of reaching is made by a notification device such as a monitor, a lamp, or a traffic light (not shown), and the control unit 40, which receives the signal indicating the reaching, sends a signal to the plasma processing apparatus to stop the etching processing or change processing conditions.

In the plasma processing apparatus, the etching processing for a target film layer on a surface of the process target 16 for which the film thickness or processing depth is detected is stopped based on the received signal for stopping etching, or after changing the processing conditions, a step of processing a next processing target 16 is performed. According to the operation, the plasma processing apparatus of the present embodiment can determine the end by using the result of detecting the film thickness or depth.

Figure 2A:
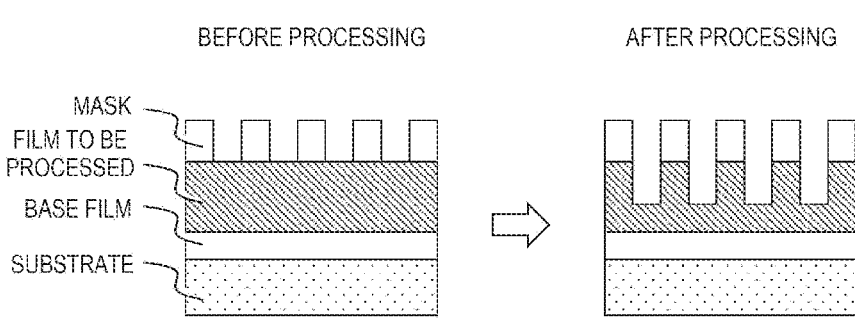
FIGS. 2A and 2B are vertical cross-sectional views schematically showing an outline of a film structure in which a plurality of layers of films are stacked, the films including a film layer of a processing target and previously disposed on an upper surface of a semiconductor wafer which is the processing target in the embodiment shown in FIGS. 1A and 1B, where
Figure 2B:
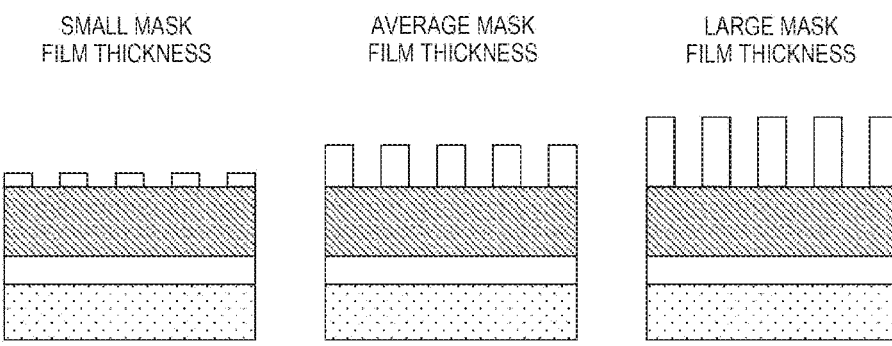

A film structure obtained by stacking films of a plurality of layers formed in advance on the surface of the processing target 16 will be described with reference to FIGS. 2A and 2B, the processing target 16 being a target subjected to the etching processing performed while the film thickness or depth is detected with the plasma processing apparatus according to the above embodiment. FIGS. 2A and 2B are vertical cross-sectional views schematically showing an outline of a film structure in which the films of the plurality of layers are stacked, the films including a film layer of a processing target and previously disposed on an upper surface of a semiconductor wafer which is the processing target processed in the embodiment shown in FIGS. 1A and 1B.

As shown in a left side of FIG. 2A, in the film structure of the surface of the processing target 16 before the processing, a base film 2 and a film to be processed 3 are stacked in a vertical direction as a lower layer and an upper layer on an upper surface of an Si substrate 1, and the films are formed. A mask 4 is disposed on the film layer of the processing target in a portion or region above an upper surface of the film to be processed 3 that is not being covered, the mask 4 made of a resin for forming a predetermined circuit pattern or a material having a high selection ratio from materials of the film to be processed.

As a result of etching such a film structure, the processed film structure acquires a structure in which a part of the film to be processed 3 is removed as shown in a right side of FIG. 2A. Meanwhile, in an actual film structure to be subjected to such etching processing, a magnitude of a film thickness of the mask 4 varies as shown in FIG. 2B. That is, regarding a plurality of wafers which are the processing targets 16, a film thickness of a mask layer before the processing (at an initial stage of the processing) may be thinner (the thickness is smaller) than an average thickness or thicker (larger) than the average thickness.

Figure 3A:
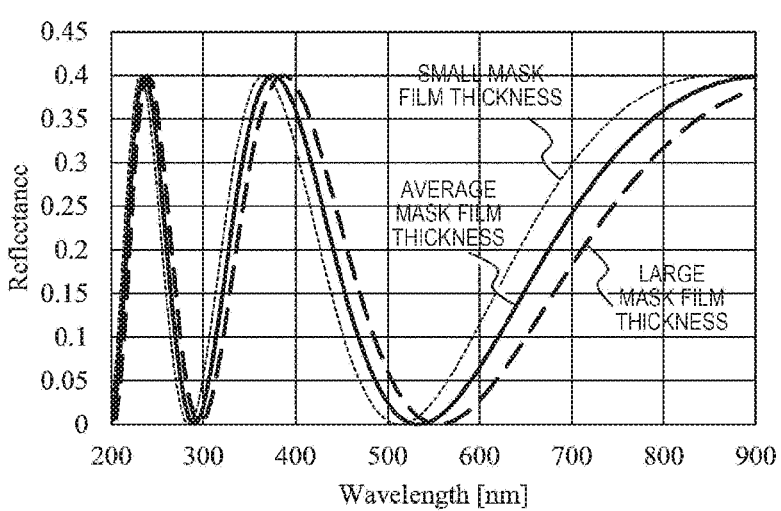
FIGS. 3A and 3B are graphs schematically showing an example of fluctuations in reflected light acquired when a plurality of wafers, having the film structure shown in FIGS. 2A and 2B, of a processing target are etched and in values of residual film thicknesses detected from the reflected light, where
Figure 3B:
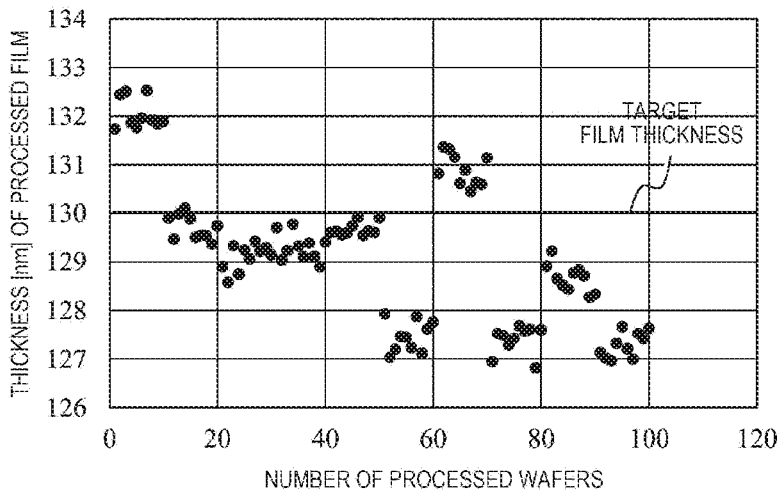

An effect of such a variation in the film thickness of the mask on the residual film thickness or depth or the determination of the end of the processing of the processing target 16 will be described with reference to FIGS. 3A and 3B. FIGS. 3A and 3B are graphs schematically showing an example of fluctuations in reflected light acquired when the plurality of wafers as the processing target having the film structure shown in FIGS. 2A and 2B are etched and in the value of the residual film thickness detected from the reflected light.

FIG. 3A is a graph showing an amount of the reflected light from the plurality of wafers when the residual film thicknesses of the films to be processed on the wafer surfaces of the processing targets 16 are the same and the initial film thicknesses of the masks are different. In the present drawing, a vertical axis represents a value when the amount of the reflected light is converted into a wafer reflectance. According to FIG. 3A, it can be seen that magnitudes of the reflectance are different even if the values of the residual film thicknesses of the films to be processed are the same due to the fluctuations of the film thicknesses of the masks. That is, it can be seen that a distribution and a profile (spectrum), indicating the residual film thickness, of the intensities of the reflected light with a plurality of wavelengths differ depending on the thicknesses of the masks.

For the plurality of wafers as the processing targets 16 having the variations in the initial film thickness of the mask having the above film structure, when one wafer having a film structure with a mask having an average value of the initial film thickness is processed, data on a pattern is acquired in advance, the pattern indicating a correlation between a pattern of values, acquired at sampling times during the processing, of the amounts of the reflected light with the plurality of wavelengths from the wafer and the residual film thickness or processing depth at each of the times detected from the amounts, and FIG. 3B shows a result of detecting the film thickness or depth and determining the end during the processing of the plurality of wafers as the processing targets 16 by using only this data.

In the present example, the plurality of wafers having variations in the film thicknesses of the masks are etched, and a residual film thickness, which is a target for determining the end, is set to 130 nm. In the drawing, a vertical axis indicates the residual film thickness, and dots in the drawing indicates values of results of measuring the residual film thicknesses by using an electron microscope by destructive inspection or the like after etching the wafers.

As shown in the present drawing, when the end is determined by using the residual film thickness or processing depth detected by using one piece of the pattern data acquired from the processing of one wafer acquired in advance, it can be seen that the actual thicknesses of the films to be processed after processing the wafers vary with respect to the target film thickness (130 nm), and an accuracy of processing of the film structure by etching processing is impaired.

In this way, when a large variation in the initial film thickness of the mask for each of the processing targets 16 presents, if the film thickness or depth is detected by using the data acquired as an example from the processing of a specific wafer, there is a risk that an accuracy of the end determination and the accuracy of the processing, as well as a processing yield, will be impaired, and a semiconductor device with a high integration cannot be manufactured.

Therefore, the plasma processing apparatus according to the present embodiment detects the film thickness or depth by using plural pieces of pattern data from the reflected light acquired during the processing of the wafers as the processing targets 16, and determines the end of the processing based on the detected residual film thickness or processing depth. In the present embodiment, regarding the plural pieces of pattern data which is similar to the pattern data shown in the example of FIG. 3B and correlates the residual film thickness (or the time after the processing is started) with data on the intensities of reflected light with the plurality of wavelengths acquired from the wafer surface at a plurality of times during the processing, in which the processing is the etching processing performed on the plurality of wafers as the processing targets 16 having the same type of film structures laminated with the film layers made of the same material in a vertical direction, a similarity between wafers is calculated in advance as a numerical value.

Figure 4A:
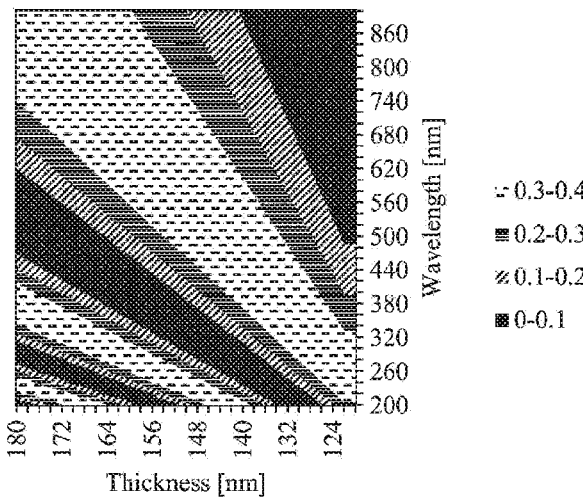
FIGS. 4A and 4B are graphs showing a residual film thickness during the processing in which the embodiment shown in FIGS. 1A and 1B performs the etching processing on the wafer having the film structure shown in FIGS. 2A and 2B, and a pattern, with a plurality of wavelengths as parameters, of values of intensities of the reflected light from the wafer, where

FIG. 4A is a graph showing a relation of the residual film thickness during the etching processing applied to the wafers as the processing target 16, and a pattern, with the plurality of wavelengths as parameters, of the values the intensities of the reflected light from the wafers.

In this drawing, the data indicating the intensity of the reflected light detected during the processing is not detected in association with the residual film thickness, but is acquired as a spectrum of the reflected light with the plurality of wavelengths at the sampling times during the processing after the processing step is started. In processing of converting the sampling times to the residual film thicknesses, the values of the film thicknesses at the times are assigned by linear interpolation from the value of an initial (a time 0) film thickness and a final (a final time) film thickness. The data in the map as shown in FIG. 4A is acquired for the processing of the wafers, and since the thickness of the processed film and an etching rate are different for each of the wafers, a range of the film thicknesses taken on a horizontal axis in the drawing and the number of the dots may be different.

Therefore, in the present embodiment, a range of the film thicknesses common to all the wafers is set by using the data, acquired in advance, on the reflected light regarding the plurality of wafers as the processing targets 16. Accordingly, pattern data indicating intensities of light having a plurality of predetermined wavelengths for each film thickness of 1 nm is created within the range of the film thicknesses. When a value of data, acquired in advance, regarding a value of the optional film thickness value can be used, the value of the data is used, and when the film thickness is not included in the data acquired in advance, the value calculated by the interpolation processing from the data on close film thicknesses is used. For example, spline completion is used for the interpolation processing.

In this way, regarding the plurality of wafers in which the initial film thickness of the mask in the film structure varies, the pattern data, with the wavelength during the processing as a parameter, of the reflected light is created by using the interpolation processing as necessary. When the end is determined by using any the same pattern data as described above, the data corresponding to the wafer having the smallest actual residual film thickness after the processing is extracted from the created pattern data. Pattern data corresponding to other wafers are compared with the data as a reference, and a similarity between the wafers is calculated based on the pattern data.

Figure 4B:
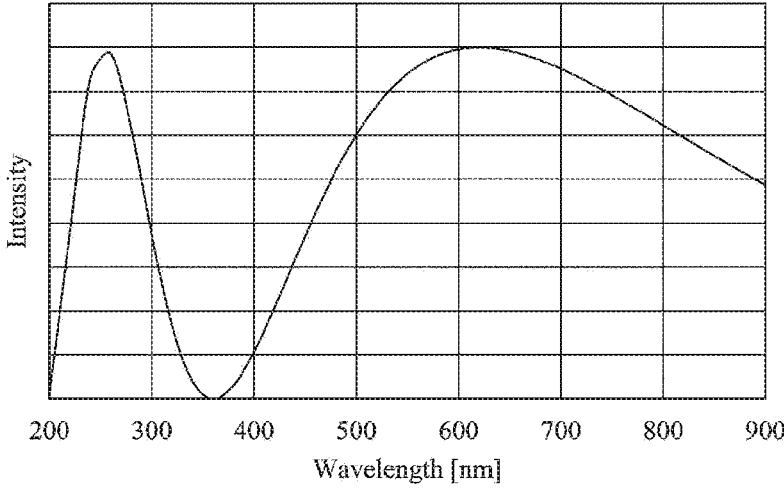

FIG. 4B shows an example of the data, with the wavelength as a parameter in one residual film thickness, on the light intensity (a film thickness spectrum) calculated in this way. The film thickness spectrum of FIG. 4B is a spectrum of one specific film thickness in FIG. 4A.

Figure 5A:
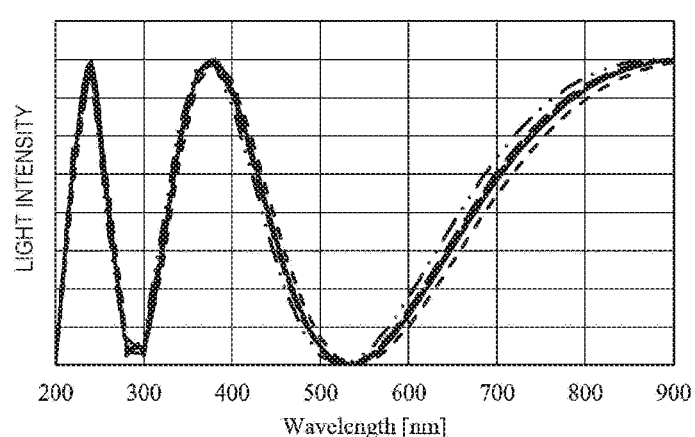
FIGS. 5A-5C are graphs showing an example of spectra of the reflected light detected during the processing of each of the plurality of wafers processed by the plasma processing apparatus according to the present embodiment shown in FIGS. 1A and 1B and a sum of differences in the spectra, where
Figure 5B:
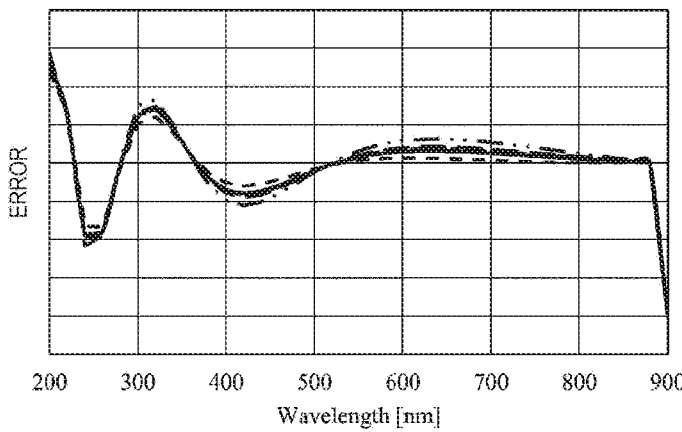

FIGS. 5 A-5C are graphs showing an example of spectra of the reflected light detected during the processing of the plurality of wafers processed by the plasma processing apparatus according to the present embodiment shown in FIGS. 1A and 1B and a sum of differences between the spectra. In FIG. 5A, spectra of predetermined film thicknesses acquired from the plurality of wafers are superimposed and displayed. As shown in this drawing, the spectra of the film thicknesses of the corresponding wafers show different values at the plurality of wavelengths. FIG. 5B shows a value of a difference (an error amount) between the spectrum value of each of the film thicknesses and an average value of the film thicknesses at the wavelengths. In this drawing, the similarity between the wafers is shown as a numerical value as the magnitude of the error amount.

Figure 5C:
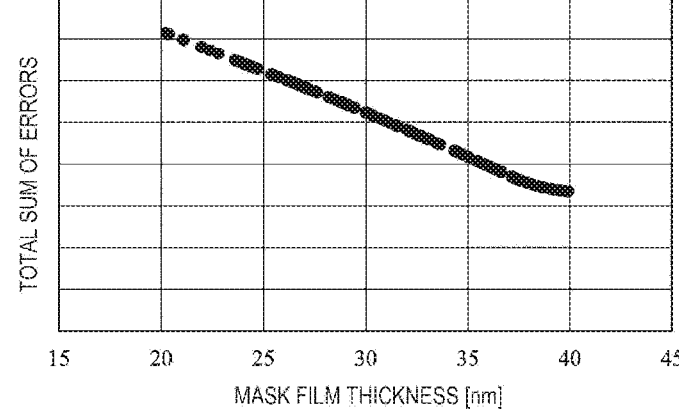

A total sum of absolute values of the errors of all the wavelengths is calculated for each of the wafers, and FIG. 5C shows a result of associating these values with the initial film thickness of the mask of each of the wafers. A vertical axis in the drawing indicates a value indicating a total sum of errors, and a horizontal axis indicates a value of the film thickness (the initial residual film thickness) of the mask before starting the etching processing of each of the wafers.

In the present example, it is assumed that a magnitude of a variation in specifications of the film layers constituting the film structure of each of the wafers, for example, a variation in the initial film thickness of the mask is unknown, and FIG. 5C shows that the calculated similarity value for each of the wafers corresponds to the initial film thickness of the mask. In the present drawing, for convenience, the value of the initial film thickness of the mask of each of the wafers and the value of the total sum of errors for each of the plurality of wavelengths in the spectrum of the optional film thickness of the wafer are plotted in association with each other, and the total sum of errors of the plurality of predetermined wavelengths in the spectrum of the film thickness of each of the wafers are shown to have a high correlation with the initial film thickness of the mask of each of the wafers. From the drawing, it can be seen that the magnitude of the structural difference in the film structures of the wafers can be detected by using the similarity of the spectrum of the film thickness of each of the wafers.

Figure 6A:
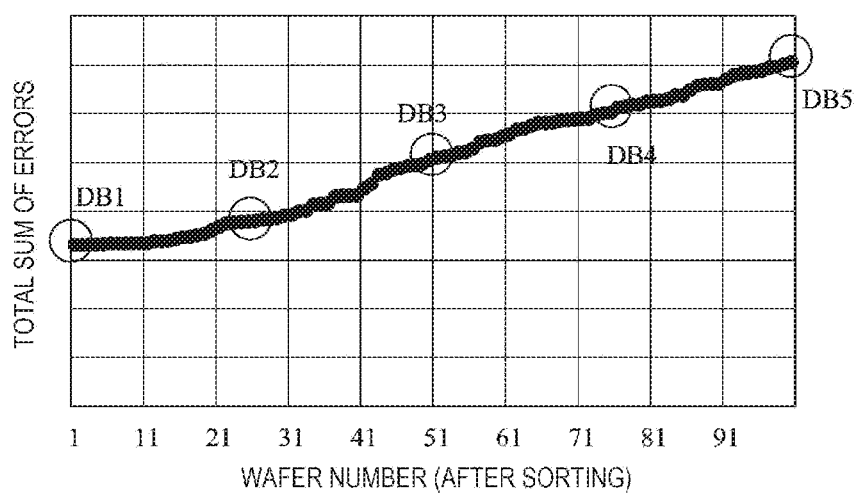
FIGS. 6A and 6B are graphs showing the total sum of errors of the spectra of the reflected light detected during the processing of each of the plurality of wafers processed by the plasma processing apparatus according to the present embodiment shown in FIGS. 1A and 1B, where

Next, the plurality of wafers are rearranged in a predetermined order and assigned a code or a number to rank the wafers. For example, the plurality of wafers are ordered in ascending order of the total sum of errors calculated from the wafers. FIG. 6A shows a relation between the number of each of the plurality of wafers rearranged and ordered in this way and the total sum of errors. As described above, since the total sum of errors has a high correlation with the initial film thickness of the mask, in the present example, the smaller the wafer number, the thicker the initial film thickness of the mask, and the larger the number, the smaller the initial film thickness of the mask.

In the present embodiment, a wafer with a maximum number, a wafer with a minimum number, and a wafer having a number between the maximum and minimum numbers and having the same differences between a total sum of errors of this wafer and the total sum of errors of the wafers with the maximum and minimum numbers are selected from the plurality of the wafers ordered in this way, and the three pieces of data on the patterns of the intensities of the reflected light which corresponds to the three selected wafers and has the wavelengths, as the parameters, calculated by interpolating as necessary are used as a database. By selecting the data, used as the database in this way, on the pattern of the spectrum in the reflected light, the data on the reflected light corresponding to minimum and maximum initial film thicknesses of the mask having the variation can be used as a database.

Figure 6B:
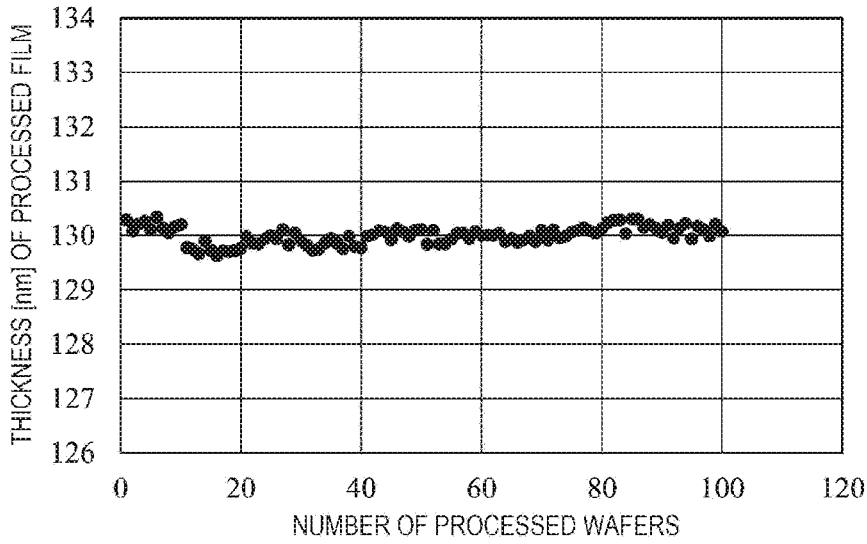

The database acquired by being selected in this way is used to select comparison data, and the film thickness or depth of the wafer is detected by comparing the comparison data with measured data, and a result of performing the end determination based on the above result is shown in FIG. 6B. In the present example, the optimum database determiner 124 shown in FIG. 1A selects the pattern data in which matching residue with the database is minimum. In the present example, as in FIG. 3B, the plurality of wafers having the variation in the initial film thickness of the mask are used.

As shown in the present drawing, it can be seen that the residual film thicknesses after processing of all the wafers are close to the target of 130 nm, and the magnitude of the errors of the thicknesses is 0.5 nm or less, which is within the predetermined allowable range, and a target film layer of the processing target can be processed with a high accuracy. From this result, according to the above embodiment, even when the variations in a dimension, a shape, a material, etc., of the film structure on the wafer including the film layer of the processing target are unknown, it is clear that the amount related to processing (hereinafter, referred to as a processing amount) such as a residual film thickness or processing depth during the processing can be detected with the high accuracy, and can be used to determine the end of processing with the high accuracy.

The variations in the shape, the dimensions, the materials, etc., of the film structures among the plurality of wafers are one of stress factors in detecting the processing amount during the processing, and the present embodiment is not limited to the above types of the variations, but can be applied to cases where variations in characteristics of the film structure and fluctuations in processing conditions occur in the plurality of the wafers, the variations in characteristics of the film structure including the thickness of the underlying film of the films to be etched, the width and depth of the trench, the structure of the film below the films to be etched or the surrounding structure, and the like, and the fluctuations in the processing conditions including a fluctuation in a position or range in which the reflected light is detected, a fluctuation in the selection ratio of the material of the films to be etched to the materials of the other films, a fluctuation in a light source spectrum, a fluctuation in changes in plasma light over time, and the like. It is clear that the index of light intensity of the present embodiment, data shaping and signal processing of each of the wafers, the method for quantifying the wafer similarity, and the method for selecting the plurality of databases are not limited to the above.

In the present embodiment, the data on the three wafers selected from the plurality of ordered wafers is used as a database, but the number of databases is not limited to three. For example, in the numbers of the ordered wafers, by using, as the databases, three or more pieces of data on the intensity pattern of the reflected light of the wafers with the maximum number, the minimum number, and the number which divides the maximum and the minimum numbers into substantially equal intervals, it is clear that the same effect as that of the present embodiment can be exerted. By using, as the databases, the data on the plurality of wafers having a maximum value and a minimum value of the total sum of errors of the ordered wafers and a total sum value of errors which divides the two values into substantially equal intervals, it is clear that the same effect as that of the present embodiment can be exerted.

The following is an example in which the value of the change over time (time change) in the intensity of the reflected light with a specific wavelength from the wafer is used as the numerical value of the similarity of each of the wafers. Also in the present example, the end of the processing is determined based on the processing amount during the processing of the wafer, the processing amount detected by using plural pieces of data. The other conditions are the same as those in the first embodiment.

Figure 7A:
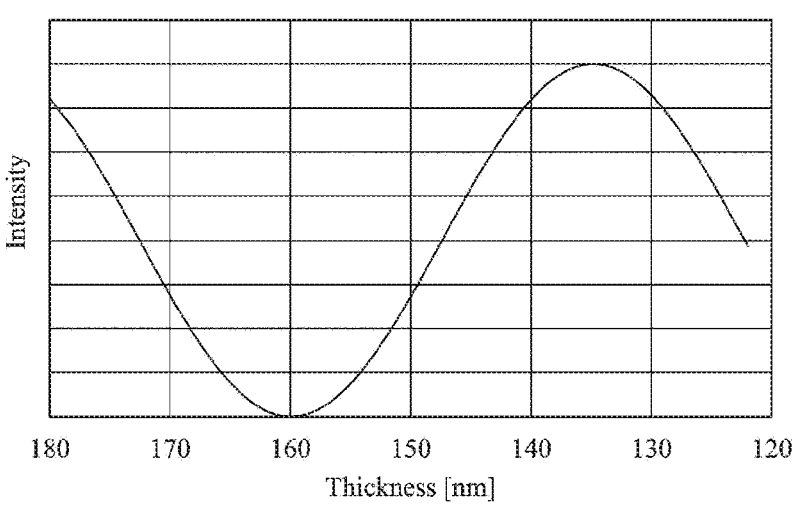
FIGS. 7A and 7B are graphs showing an amount regarding light from a wafer surface acquired when a modification of the plasma processing apparatus according to the embodiment shown in FIGS. 1A and 1B processes the film structure shown in FIGS. 2A and 2B, where
Figure 7B:
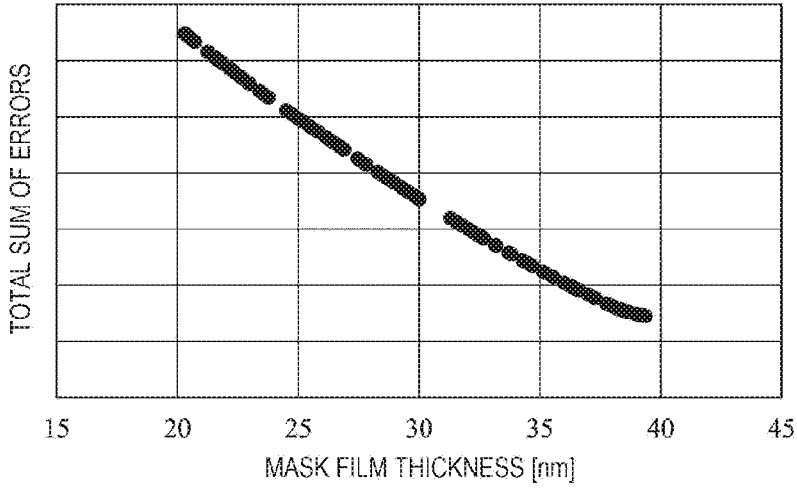

FIGS. 7A and 7B are graphs showing an amount regarding light from a wafer surface acquired when a modification of the plasma processing apparatus according to the embodiment shown in FIGS. 1A and 1B processes the film structure shown in FIGS. 2A and 2B. FIG. 7A is a graph showing an example of a change over time in the intensity of the light with a specific wavelength of reflected light from the wafer surface during the processing of the wafer. In the present drawing, the change in the light intensity is shown with a horizontal axis of the residual film thickness during the processing with a parameter indicating the change over time.

Similar to the above embodiment, with respect to data indicating the spectrum of the reflected light of each of the wafers acquired during the processing of the plurality of wafers, the film thickness is allocated and the film thickness range is determined, and the spectrum data is interpolated, and an example of a change in the light intensity due to the film thickness at a specific wavelength of the acquired interpolation processing data is shown in FIG. 7A. It can be seen that the light intensity changes so as to vibrate depending on the film thickness.

FIG. 7B is a graph of an example showing a correlation between a mask film thickness and an error of each of the wafers with respect to an average of all the wafers in the change over time in the intensity of the reflected light of the specific wavelength shown in FIG. 7A. Similar to spectrum comparison in the wafers with specific film thicknesses of the above embodiment, FIG. 7B shows the result of extracting the change over time in the light amount at the same wavelength of each of the wafers and calculating a sum of squared errors from the average value. From this drawing, it can be seen that the total sum of errors in each of the wafers shows a high correlation with the mask film thickness even when the change over time of the light amount is used, and a difference in a structure can be clarified from similarities of the spectra of the wafers.

FIG. 8 shows results of plotting a relation between numbers of the wafers and a sum value of the errors by numbering and ordering the plurality of wafers in the ascending order of the sum value of the errors. As shown in FIG. 7B, the sum value of the errors has a high correlation with the mask film thickness, and the smaller the wafer number, the larger the mask film thickness, and the larger the wafer number, the smaller the mask film thickness. From this, it is shown in FIG. 8 that the sum value of the errors increases uniformly in the order of the wafer numbers.

In the present example, the results of ordering in this way are used to select, from the plurality of the wafers, three wafers of a wafer with a maximum number, a wafer with a minimum number, and a wafer whose number is between the maximum and minimum numbers and which has the equal values of the total sum of errors (values on a vertical axis in FIG. 8) or has values close enough to be considered to be the equal values of the total sum of errors, and data on the selected wafers is used as data in the waveform pattern database 122. By using such data, the processing amount can be detected by using the reflected light from the wafer with the high accuracy corresponding to the minimum and maximum values of the initial mask film thickness where the values vary.

The end is determined based on the result of detecting the processing amount during the processing by using the databases including the plural pieces of data selected and determined in this way, and as a result, the film thickness after the processing is close to the target of 130 nm for all the wafers, and the error is 0.5 nm or less as in FIG. 6B of the first embodiment. Therefore, it is clear that in the detection of the processing amount by using the plural pieces of data of the present embodiment, although a structural variation is unknown, an accurate processing amount can be detected and the end can be determined with the high accuracy.

Next, as a parameter for expressing a similarity of each of preprocessed wafers as a numerical value, an example will be described in which a correlation between the residual film thickness of the processing target included in the film structure on the wafer and two-dimensional data (map) on the plurality of wavelengths of the reflected light from the film structure is used. The conditions excluding the parameters for calculating the similarities in the plurality of wafers are the same as those in the above embodiments or the embodiment shown in FIGS. 7 and 8.

Similar to the above embodiments, FIG. 9 shows an example of the film thickness, the wavelength, and interpolation processing data on the intensity which are respectively acquired by allocating the film thicknesses and determining the film thickness range with respect to the spectrum data of each of the plurality of processed wafers, and interpolating the spectrum data. FIG. 9 is a graph showing, as a map, a relation of a residual film thickness during the processing and a pattern, with the plurality of wavelengths as parameters, of the values of the intensities of the reflected light from the wafer, in which the processing is etching processing performed on the wafer having the film structure shown in FIGS. 2A and 2B by another modification of the plasma processing apparatus according to the embodiment shown in FIGS. 1A and 1B.

The data shown in the present drawing is a graph similar to a graph acquired by cutting out a part of the map in FIG. 4A. From the data in this drawing, similar to the spectrum comparison in the wafers with the specific film thickness in the above embodiment according to FIGS. 4A and 4B, as a result of calculating a sum of the average value of all the wafers and error absolute values of the wafers in the interpolation processing data, the same correlation between the mask film thickness and the error amount as shown in FIG. 5C is acquired.

Therefore, the database of the waveform pattern database 122 similar to that in FIG. 6A can be determined by using such an error amount, and as a result, the film thickness can be estimated with the high accuracy even for the variations in the mask as in FIG. 6B. Therefore, also in the present example, it is clear that although the variations in the characteristics of the film structure including the film to be processed are unknown, an accurate processing amount can be detected and the end can be determined with the high accuracy.

Next, an example will be described, in which signal processing such as low-pass filtering, differential value calculation, and light amount standardization is applied to the data on the reflected light of the plurality of wafers processed in advance, the processing amount during the processing is detected by using the data indicating the light intensity of the reflected light acquired by expressing the similarity of each of the wafers as a numerical value based on the data acquired by performing the signal processing, and the end is determined based on the detection result. In the present example, a condition other than that of the above signal processing is the same as that in the embodiments or modifications shown in FIGS. 1A to 9.

Similar to the above embodiments, at the times in the data acquired by associating the residual film thickness with and determining the range of the residual film thicknesses by the spectrum data acquired at a plurality of sampling times during the processing of the wafers, and performing the interpolation processing on the spectrum data, the amounts of light with the plurality of wavelengths re standardized by the average value of the amounts of the light with the plurality of wavelengths in the reflected light. Regarding the wafers, a change in the intensity of the light with a specific wavelength with respect to a change in the residual film thickness is extracted from the data acquired by the standardization, and a first derivative value acquired by the LPF and S-G method is calculated in a time direction for the extracted change over time in the light amount of each of the wafers. A result is shown in FIG. 10.

FIG. 10 is a graph showing an example of a change in a value of a first derivative in an intensity of light with a specific wavelength with respect to a change in the residual film thickness of the film of the processing target acquired during the processing, in which the processing is etching processing performed on the wafer having the film structure shown in FIGS. 2A and 2B by another modification of the plasma processing apparatus according to the embodiment shown in FIGS. 1A and 1B. The change over time in the amount of the light intensities with respect to the light with the specific wavelength in the reflected light shown in FIG. 10 has a shape acquired by differentiating in FIG. 7A with respect to a film thickness direction. The sum of the average value of all the wafers and a sum of squared errors of the differential values of the change over time in the light amount, and as a result, the same correlation between the total sum of errors and the mask film thickness is acquired as in FIG. 7B.

Therefore, data in the database of the waveform pattern database 122 same as that in FIG. 8 can be selected by using such an error amount, and as a result, the film thickness can be estimated with the high accuracy even for the variations in the mask as in FIG. 6B. Therefore, also in the present example, it is clear that although the variations in the structure are unknown, an accurate processing amount can be detected and the end can be determined with the high accuracy.

Next, an example will be described, in which the processing amount during the processing is detected by using the data on the light intensity of the reflected light acquired by expressing, as a parameter, a similarity in the wafers processed in advance by using the data, with data shaping related to the wavelength axis, on the reflected light from the wafer, and the end is determined based on the detection result. In the present example, a condition other than the above signal processing is the same as that in the embodiments or modifications shown in FIGS. 1A to 9.

In the present example, the spectrum data on the reflected light acquired at the sampling times during the processing of the plurality of wafers processed in the same manner as in the above example is associated with the residual film thickness, determines the range of the residual film thicknesses, and is performed with the interpolation processing in a time axis (a film thickness axis) direction. Regarding the wavelength axis, the data in the wavelength direction is interpolated so that the wavelength step is 5 nm at a wavelength of 240 to 840 nm, and the data is reduced. FIG. 11 shows an example of the spectrum data acquired as a result and corresponding to a thinnest residual film thickness of any wafer among the plurality of wafers.

FIG. 11 is a graph showing an example of intensities of reflected light with a plurality of wavelengths when a film of a processing target acquired during the processing has a predetermined residual film thickness, in which the processing is etching processing performed on the wafer having the film structure shown in FIGS. 2A and 2B by another modification of the plasma processing apparatus according to the embodiment shown in FIGS. 1A and 1B. This spectrum has a shape acquired by cutting out a part of the spectrum in FIG. 4B.

Also in the present example, the data of this spectrum is used, as in the above embodiment, the similarities of the structures in the plurality of wafers are ordered and the data is selected, the selected data is used to detect the residual film thickness of the wafer during the processing and determine the end. As a result, variations in the residual film thickness after the processing of the wafer similar to those in the above embodiment are acquired. Therefore, also in the present example, it is clear that although the variations in the structure are unknown, an accurate processing amount can be measured and the end can be determined with the high accuracy.

Next, an example in which the principal component values of the principal component analysis are used as the parameters for expressing, as numerical values, the similarity of the preprocessed wafer will be described. The configuration is the same as that of the embodiments and modifications shown in FIGS. 1A to 12B above, except that the principal component analysis is used to indicate the similarity in the wafers.

Similar to the above embodiment, the data indicating the spectra of the reflected light acquired at the plurality of sampling times during the processing of the plurality of wafers is associated with the residual film thickness of the processing target and determines the range of the residual film thicknesses, the interpolation processing is performed on the spectrum data, and the spectrum data of the reflected light corresponding to the same residual film thickness is extracted from the wafers. The principal component analysis is performed by using the spectra of the extracted wafers, and in FIGS. 12A and 12B show a relation between the initial film thickness of the mask film layer of each of the wafers and the first principal component and a relation between the initial film thickness of the mask film layer of each of the wafers and the second principal component, respectively.

Figure 12A:
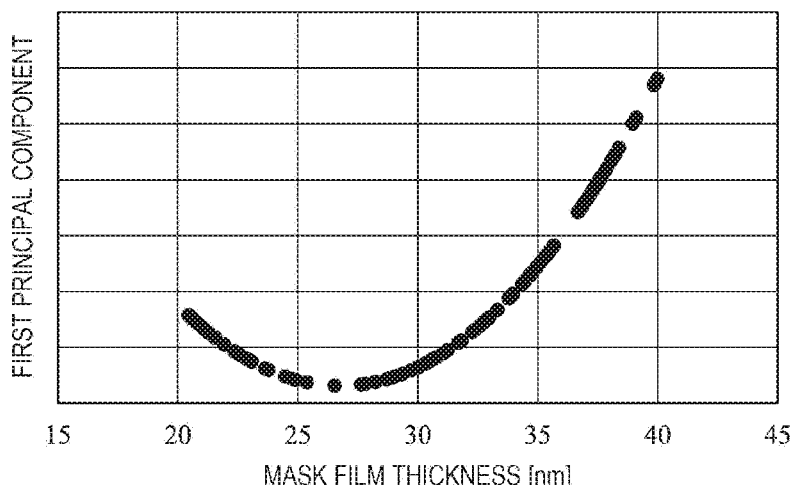
FIGS. 12A and 12B are graphs showing an example of a relation between an initial thickness of a mask layer of each of the wafers and first and second principal component values acquired by principal component analysis of plural pieces of light intensity data on the reflected light from the film structure of the wafer surface acquired during processing, in which the processing is etching processing performed on the plurality of wafers having the film structure shown in FIGS. 2A and 2B by another modification of the plasma processing apparatus according to the embodiment shown in FIGS. 1A and 1B, where
Figure 12B:
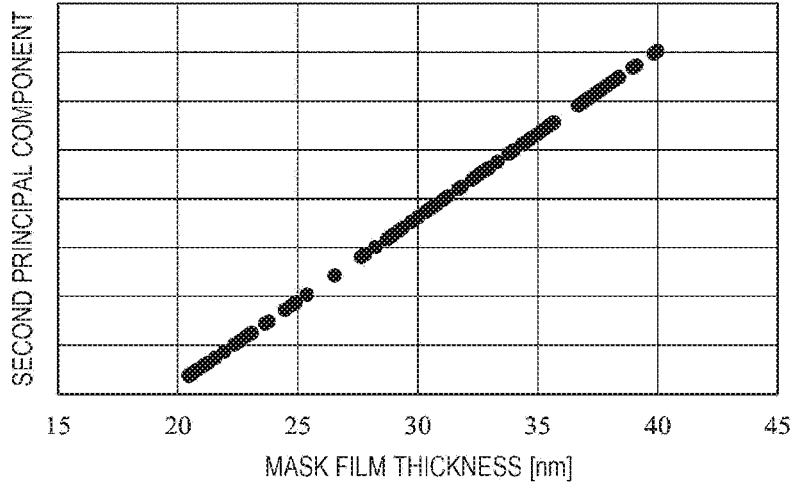

FIGS. 12A and 12B is a graph showing an example of a relation between an initial thickness of a mask layer of each of the wafers and the first and second principal component values acquired by the principal component analysis of the plural pieces of light intensity data on the reflected light from the film structure of the wafer surface acquired during the processing, in which the processing is etching processing performed on the plurality of wafers having the film structure shown in FIGS. 2A and 2B by another modification of the plasma processing apparatus according to the embodiment shown in FIGS. 1A and 1B.

In these drawings, it can be seen that the first principal component value shown in FIG. 12A and the second principal component value in FIG. 12B both show a high correlation with the initial film thickness of the mask layer. The first principal component value changes like a quadratic function that increases or decreases and includes a local minimum value with respect to the value of the initial film thickness of the mask. Therefore, the initial film thickness of the mask layer cannot be uniquely determined from the first principal component value of the data indicating the spectra of the reflected light of the plurality of wafers having a correlation as shown in FIG. 12A.

Meanwhile, the second principal component value shown in FIG. 12B changes with a substantially constant slope as in a linear function with respect to the change in the initial film thickness of the mask. From this, the correspondence between the second principal component value shown in the present drawing and the initial film thickness of the mask layer can be used to detect the initial film thickness of the mask layer of each of the plurality of wafers and the similarity of the wafers based on the initial film thickness. Therefore, in the present example, the second principal component value is calculated from the data on the reflected light acquired at the sampling times during the processing of the plurality of wafers, the plurality of wafers are ordered by using the similarities in the wafers acquired based on the calculation. Data indicating the pattern of the intensities of the light with the plurality of wavelengths in the reflected light is selected based on the ordering result, and the data on the selected wafers is used as the data in the waveform pattern database 122.

In the present example, the plural pieces of data in the waveform pattern database 122 are used, and the processing amount at each of the sampling times during the processing is detected based on the data acquired during the processing of any wafer and indicating the intensity of the reflected light from the wafer, and the end of the processing is determined. As a result, as in FIG. 6B, the residual film thickness after the processing is closed to the target of 130 nm for all the wafers, and the error is 0.5 nm or less. Therefore, also in the present example, it is clear that although the variations in the characteristics of the film structure are unknown, an accurate processing amount can be detected and the end can be determined with the high accuracy.

Next, an example will be described, in which when variations exist in the initial film thickness of the mask layer constituting the film structure of the wafer and in the film thickness of the base film below the film to be processed, a similarity of data on interference light from the plurality of the pre-processed wafers is quantified by using manifold learning. In the present example, a condition other than that quantifying the similarity by using the manifold learning also has the same configurations as those of the embodiments and modifications shown in FIGS. 1A to 12B.

Similar to the present example, the data indicating the spectra of the reflected light acquired at the plurality of sampling times during the processing of the plurality of wafers is associated with the residual film thickness of the processing target and determines the range of the residual film thicknesses, the interpolation processing is performed on the spectrum data, and the spectrum data on the same residual film thickness is extracted from the wafers.

In the present example, the extracted spectrum data is used, and the similarity of the wafers is quantified by using Isometric Mapping, which is a nonlinear dimension reduction method in the manifold learning. In the Isometric Mapping, the spectrum of each of the wafers is used as a data dot, and neighborhood relations, acquired by a K-nearest neighbor algorithm with the data dots, of the data dots are calculated as values.

Next, the calculated neighborhood relation values are used to calculate geodesic distances between the data dots on a K-nearest neighbor graph, and a geodesic distance matrix is created with the values of the geodesic distances as components. The data dots are projected onto a low-dimensional space using multi dimensional scaling (MDS) for the created geodesic distance matrix. According to the above procedures, the wafers are mapped to the low-dimensional space based on the similarities in the data on the corresponding spectra, and plural pieces of data in the database used to estimate the processing amount such as the residual film thickness can be selected by using the mapping result.

In the present example, the spectrum data, preprocessed by using the Isometric Mapping, on the reflected light of the plurality of wafers is mapped based on the similarity. FIG. 13 shows a result of plotting a correlation between a first component that maximizes dispersion of the plural pieces of data corresponding to each of the wafers in the mapped low-dimensional space and the initial film thickness of the mask layer of each of the wafers.

FIG. 13 is a graph showing an example of a relation between the initial thickness of the mask layer of each of the wafers and a maximum value of a dispersion of a distance between data acquired by using Isometric Mapping on the plural pieces of light intensity data on the reflected light from the film structure on the wafer surface acquired during the processing, in which the processing is etching processing performed on the plurality of wafers having the film structure shown in FIGS. 2A and 2B by another modification of the plasma processing apparatus according to the embodiment shown in FIGS. 1A and 1B. It can be confirmed that the first component acquired by the Isometric Mapping shows a high correlation with the mask film thickness.

In the present example, the wafers are ordered according to the values of similarities in the wafers based on a value of the acquired first component, and based on the result, a database of the reflected light spectra is selected as the data in the waveform pattern database 122. The plural pieces of data are used to detect the processing amount at the plurality of sampling times during the processing of any wafer, and the end is determined based on the result of detecting, and as a result, the residual film thickness after the processing is close to the target of 130 nm for all the wafers, and the error is 0.5 nm or less as in FIG. 6B. Therefore, also in the present example, it is clear that although an amount of the variations in the characteristics of the film structure is unknown, an accurate processing amount can be detected and the end can be determined with the high accuracy.

In the embodiment or modification described above, as shown in FIGS. 6A and 6B or 8, the plurality of wafers are numbered and ordered according to a magnitude of the parameter values indicating the similarities in the data on the reflected light from the wafers acquired during the processing of the plurality of preprocessed wafers, and the processing amount at the plurality of sampling times during the processing of any wafer is detected by using the reflected light data of the wafer, corresponding to the parameter values that change according to the numbers for the plurality of wafers, an average value of the parameter values, maximum and minimum values of the differences (the errors) or the total sum of errors, and the parameter values that substantially divide the difference between the maximum and minimum values.

When the reflected light data corresponding to a certain wafer is selected from the data related to the plurality of preprocessed wafers, instead of selecting the above data, as the data to be used for detecting the processing amount, the data in the waveform pattern database 122 may be selected by using the information on the range of wafers in which the processing amount can be detected with an error within the predetermined allowable range. An example of selecting such data and detecting the processing amount will be described below.

In the present example, before selecting the data of the waveform pattern database 122, for the light intensity data, which is candidates for the database, of the reflected light with the plurality of wavelengths acquired during the processing of the plurality of wafers, the data corresponding to any wafer is used as reference data to detect another wafer, and a predetermined processing amount of (for example, a specific residual film thickness of the end or the like) during the processing is calculated as an estimated film thickness by a method such as simulation. The error between the actual value of the specific residual film thickness and the estimated film thickness is calculated for each of the other wafers to be detected.

By repeating the above calculation of the errors with each of the plurality of wafers as the reference data wafer and the other wafers as wafers to be detected, a table or matrix whose components are the error values of the predetermined residual film thicknesses of the other wafers detected with reference to each of the plurality of wafers is acquired. An example of such a table is shown in FIG. 14.

FIG. 14 is a table showing an example of a data table whose component is a value of an error of a predetermined residual film thickness of another wafer detected by using each of the plural pieces of light intensity data on the reflected light from the film structure on the wafer surface acquired during the processing, in which the processing is etching processing performed on the plurality of wafers having the film structure shown in FIGS. 2A and 2B by another modification of the plasma processing apparatus according to the embodiment shown in FIGS. 1A and 1B. In the present example, the data in the waveform pattern database 122 is selected by using the table shown in FIG. 14.

In the present example, when the error of the estimated film thickness in the table shown in FIG. 14 is within the predetermined allowable range (for example, 1 nm or less), it is determined that the residual film thickness can be detected. That is, by comparing 1 nm which is an upper limit of the allowable range with errors in the estimated film thicknesses of other (n−1) wafers detected by using the reflected light data corresponding to any one of the n wafers each having one number (a database wafer number), a combination of the wafers can be acquired in which it is determined the residual film thickness can be detected by using the data (the comparison data) on the other (n−1) wafers for any wafer. In other words, for n wafers to be estimated for the film thicknesses, a combination of database wafers in which the film thickness can be detected with an error within the above allowable range can be selected.

A plurality of combinations of such database wafers are present, and these combinations are in the data table shown in FIG. 15. FIG. 15 is a table showing a combination of database wafers in which the residual film thickness of n wafers selected from the data table according to the another modification of the embodiment of the invention shown in FIG. 14 can be detected. Here, the table in FIG. 15 is arranged in order from a combination with a smallest number of the database wafers used among the plurality of combinations. For example, when a topmost combination in FIG. 15, which has the smallest number of database wafers, is selected, the reflected light data corresponding to the database wafers is selected as the data in the waveform pattern database 122.

The data in the waveform pattern database 122 selected in this way is used to detect the processing amount during the processing of an optional wafer and determine the end, and as a result, the film thickness after the processing is close to the target of 130 nm for all the wafers and the error is 0.5 nm or less as in FIG. 6B. Therefore, also in the present example, it is clear that although the variations in the characteristics of the film structure are unknown, an accurate processing amount can be detected and the end can be determined with the high accuracy.

Next, an example will be described in which the matching database calculator 120 in FIG. 1B is used to detect the processing amounts at the plurality of the sampling times during the processing of the wafer and determine the end of the processing. In the present example, a condition other than that using the database calculator 120 also has the same configurations as those of the embodiments and modifications shown in FIGS. 1A to 15.

A database is selected in the same manner as in the first embodiment, and the selected data on the wafer is determined as the database in the waveform pattern database 122. The end is determined by a processing amount monitor using a plurality of determined databases, but in the present embodiment, the database in the waveform pattern database 122 used for estimating the film thickness is calculated by using the matching database calculator 120 in FIG. 1B, and used for estimating the film thickness. The specific procedure is described below.

The data D2 acquired by acquiring a spectrum at one time measured from the wafer whose thickness is to be estimated and processing the spectrum by the digital signal processing unit 100 is supplied to the matching database calculator 120. In the matching database calculator 120, the plurality of databases are also supplied from the waveform pattern database 122, for example, a mixed database DBnm ($\alpha$) (=$\alpha$×DBn+(1−$\alpha$)×DBm) is generated by mixing two sets of databases DBn and DBm at an optional mixing ratio $\alpha$. In the matching database calculator 120, the data D2 is compared with the mixed database DBnm ($\alpha$) to determine the combination of the database numbers n and m with the smallest error from the data D2 and determine the mixing ratio $\alpha$.

The determined mixed database DBnm ($\alpha$) is supplied to the waveform pattern database 122, and in the waveform comparator 102, the film thickness at a current time is determined by using the database of the waveform pattern database 122 including the mixed database DBnm ($\alpha$). The mixed database DBnm ($\alpha$) used at the current time is supplied to the optimum database determiner 124 together with the combination of the database numbers n and m and the mixing ratio $\alpha$.

For the determination of the optimum database in the optimum database determiner 124, the database having the minimum error from the measurement spectrum may be selected as in the first embodiment. In the present embodiment, a mixed database having a spectrum close to the measurement spectrum at each time is generated, and thus the mixed database at each time may be determined as the optimum database.

The film thickness at each time is determined from the optimum film thickness or depth determiner 106 based on the determined optimum database. In the present embodiment, the film thickness estimation is performed by using the mixed database at each time as the optimum database, and as a result, similar to FIG. 6B in the first embodiment, the film thickness after the processing is close to the target of 130 nm for all the wafers, and a film thickness estimation error is reduced as compared with the first embodiment.

As in the present embodiment, by generating a database close to the spectrum of the wafer whose film thickness is to be estimated by the matching database calculator 120, the film thickness can be estimated with a higher accuracy than that in setting the data of the preprocessed wafer in the database. From the above, it is clear that in the processing amount monitor by using the plurality of databases of the present embodiment, although a structural variation is unknown, an accurate processing amount can be measured and the end can be determined with the high accuracy.

In the above example, a technique for detecting the processing amount during the processing of the wafer when the information on the characteristics of the film structure of the wafer is unknown is described. Next, a case where information about the characteristics of the film structure other than the film to be processed of the wafer can be acquired before the start of processing of the wafer will be described. In the present example, the conditions other than this point has the same configuration as that of the first embodiment.

In the present example, for example, when the initial film thickness of the mask layer of each wafer as information on the characteristics of the film structure other than the film to be processed is acquired before the start of processing, the data stored in the waveform pattern database 122 and used for detecting the processing amount is determined by using the information on the initial film thickness of the mask layer. First, the wafers are ordered according to the magnitude of the initial film thickness value of the mask layer of each wafer, wafer numbers are assigned in descending order of the film thicknesses, and a wafer number similar to those on the horizontal axis in FIG. 6A is determined for each of the plurality of wafers. Similar to the above embodiment, data on the reflected light of wafers with numbers corresponding to a maximum value and a minimum value of the initial film thickness of the mask layer, and a wafer with a number being a value that divides the maximum and minimum values at substantially equal intervals is selected as data in the waveform pattern database 122.

The plural pieces of selected data are used to process the target wafer and detect the processing amount during the processing, and the end is determined based on the detection result, and as a result, the film thickness after the processing is close to the target of 130 nm for all the wafers, and the error is 0.5 nm or less as in FIG. 6B of the above embodiment. Therefore, it is clear that in the processing amount monitor by using the plurality of databases of the present embodiment, although a structural variation is unknown, an accurate processing amount can be measured and the end can be determined with the high accuracy.

FIG. 19 shows an example of a configuration of a monitoring system that manages information between a processing apparatus and a processing apparatus when information on the wafer, in particular, information on the characteristics of the film structure can be acquired before the processing as in the present embodiment. FIG. 19 is a block diagram schematically showing an outline of a configuration of a system for monitoring the plasma processing apparatus according to the embodiment shown in FIGS. 1A and 1B.

In the example shown in this drawing, a detector (not shown) in a processing apparatus A detects characteristics such as the dimensions of the film structure including the initial film thickness of the mask before processing the wafer in a processing state 1, data indicating the acquired result is supplied to the processing apparatus A, and the wafer is processed in the processing apparatus A by using the data. Information on the characteristics of the film structure of the wafer in the processing state 1 and information on the processing state containing the processing amount of the film layer to be processed during the processing are supplied to a monitoring system, for example, monitoring device A or B, which is communicably connected to each of the processing apparatuses, so that the information also can be used for other processing apparatuses such as processing devices B, C, and D that are communicably connected to these monitoring devices.

Information such as processing conditions for each of the wafers in each of the processing apparatuses can also be used in a subsequent processing apparatus via the monitoring system. Therefore, each of the processing apparatuses can select a database similar to that in the present example based on information on processing or measurement before this processing, and high-precision processing can be implemented by selecting a database or the like using information on the processing state of the wafer in each of the processing apparatuses.

Next, an example of selecting the reflected light data to be used for detecting the processing amount when the position or range on the wafer for detecting the reflected light of the wafer during the processed fluctuates will be described. The conditions other than this point are the same as those of the embodiments or modifications shown in FIGS. 1A to 15.

FIG. 16 is a top view schematically showing a position of the wafer surface for detecting the reflected light from the wafer when the plasma processing apparatus according to another modification of the embodiment shown in FIGS. 1A and 1B performing the etching processing on the plurality of wafers having the film structure shown in FIGS. 2A and 2B. In particular, this drawing shows, on one virtual wafer, positions where two different plasma processing apparatuses detect the reflected light on the wafer.

As in the present example, when the position where the reflected light is detected, the wavelength to be detected, and the range of light intensities acquired by the plurality of plasma processing apparatuses are different, the initial film thickness of a mask to be detected may vary as shown in FIG. 2B, and due to this variation, a correlation changes between a film thickness of a film to be etched in each of the apparatuses and a spectrum of reflected light from the film. A proportion of patterns shown in FIG. 2A and a proportion of other patterns within a detectable range change depending on the wavelength or intensity range of the reflected light spectra, and thus a relation between the film thickness of the film to be etched and the spectrum of the reflected light may fluctuate depending on the wafer.

In 10 plasma processing apparatuses having the same configurations as the configuration of the plasma processing apparatus according to the embodiment shown in FIGS. 1A and 1B and having different positions where the reflected light is detected, similar to the embodiment, the inventors associate the residual film thickness with the spectrum data on the reflected light acquired during the processing of each of the plurality of wafers preprocessed by each of the plasma processing apparatuses, determine the range of the residual film thickness, perform the interpolation processing on the spectrum data, and extract the spectrum data of the reflected light corresponding to the same residual film thickness on the plurality of wafers. The extracted data is used to calculate an error amount of the spectrum of the wafer processed by each of the plasma processing apparatus with the same method, and a result of plotting a relation with the error amount for each of identification numbers of the plasma processing apparatuses is shown in FIG. 17.

FIG. 17 is a graph showing, for each of a plurality of plasma processing apparatuses, a total sum of errors of a predetermined residual film thickness of another wafer detected by using the plural pieces of light intensity data on the reflected light from the film structure on the wafer surface acquired during the processing, in which the processing is etching processing performed on the plurality of wafers having the film structure shown in FIGS. 2A and 2B by another modification of the plasma processing apparatus according to the embodiment shown in FIGS. 1A and 1B. It can be seen that the value of the total sum of errors is different in each of the plasma processing apparatuses, and the reflected light spectrum corresponding to the same residual film thickness is different in each of the apparatuses. In the present example, the reflected light data on the wafers of the plasma processing apparatus corresponding to maximum and minimum values of such an error amount and an intermediate value of the maximum and minimum values is selected as the data stored in the waveform pattern database 122 and used for detecting the processing amount.

The plural pieces of selected data are used to detect the processing amounts at the plurality of sampling times during the processing of any wafer, and the end is determined based on the result of detecting, and as a result, the film thickness after the processing is close to the target of 130 nm for all the wafers, and the error is 0.5 nm or less as in FIG. 6B. Therefore, when the relation between the film thickness and the spectrum is different in the apparatuses, it is clear that in the present example, an accurate processing amount can be measured and the end can be determined with the high accuracy.

Next, an example of selecting the reflected light data to be used for detecting the processing amount when the selection ratio of the material of the film layer to be processed to the material of the other film layer of the film structure on the wafer fluctuates will be described. The conditions other than this point are the same as those of the embodiments or modifications shown in FIGS. 1A to 17.

Also in the present example, the film structure including the film layer to be etched on the wafer is the same as that shown in FIG. 2A, and the initial film thicknesses of the mask layers of the plurality of wafers are substantially the same. Meanwhile, in the present example, the selection ratio of the mask layer to the film layer of the processing target varies in the processing of the wafers. Therefore, when the residual film thickness of the film layer of the processing target is the same for each of the wafers, the amount of scraping of the mask layer may differ in these wafers, and the residual film thicknesses of the masks of the wafers may differ. In this case, even if the plurality of wafers have the same residual film thicknesses of the film layers of the processing target, the spectrum data of the reflected light from the wafer surface is different, and the same problem is generated as that when a variation presents in the initial film thickness of the mask layer in the above embodiment.

In the present example, the spectrum data of the reflected light acquired during the processing of the plurality of wafers preprocessed in the same manner as in the embodiment of FIGS. 1A and 1B is associated with the residual film thickness and determines the range of the residual film thicknesses, the interpolation processing is performed on the spectrum data, and the spectrum data on the same residual film thickness is extracted from the data during the processing of each of the plurality of wafers. The value of an error from the average of all the wafers is calculated for the extracted spectrum data, the calculated error is associated with the film thickness of the mask of each of the wafers, and as a result, a high correlation is acquired between the error and the residual film thickness of the mask as in FIG. 5C. The wafers are sorted and ordered based on the error amount, and based on the result acquired by sorting, the spectrum data of the reflected light corresponding to the plurality of wafers is selected as the data in the waveform pattern database 122 as in the embodiment.

The plural pieces of selected data are used to determine the end, and as a result, the film thickness after the processing is close to the target of 130 nm for all the wafers, and the error is 0.5 nm or less as in FIG. 6B. Therefore, when the relation between the film thickness and the spectrum is different in the apparatuses, it is clear that in the present example, an accurate processing amount can be measured and the end can be determined with the high accuracy.

Next, an example using the time transition on the residual film thickness detected in the optimum database determination by the optimum database determiner 124 shown in FIG. 1B will be described. The condition other than this point has the same configuration as that of the first embodiment.

The change over time, detected by using the database in the film thickness or depth calculation unit 30 shown in FIGS. 1A and 1B, in the residual film thickness at each of the sampling times during the etching is, for example, data 1 and 2 in FIG. 18. FIG. 18 is a graph showing an example of a change over time, detected by using the reflected light from the wafer during processing, in the residual film thickness of the film layer of the processing target on the wafer, in which the processing is to etch the wafer having the film structure shown in FIGS. 2A and 2B by the plasma processing apparatus according to another modification of the embodiment shown in FIGS. 1A and 1B. In the present example, the residual film thickness is estimated based on a linear correlation between the detected residual film thickness shown in data and the time during the processing.

For example, in each of the sampling times during the processing, a correlation coefficient is calculated from the values of the plurality of residual film thicknesses detected at a plurality of past times up to the current time during the processing and the past times, the data with a large correlation coefficient as the data in the optimal database. For example, in a case where a mutual relation that can be represented as a substantially linear line as shown in the two pieces of data 1 and 2 shown in FIG. 18 is acquired, an absolute value of a correlation coefficient of the data 1 is 0.99, and an absolute value of a correlation coefficient of the data 2 is 0.95. Therefore, in the present example, the data 1 having a large correlation coefficient is selected as the data in the optimum database.

The spectrum data on the reflected light selected as the data in the optimum database in this way is used to detect the processing amount at an optional time of the plurality of sampling times during the processing, and the end is determined based on the result of detecting, and as a result, the film thickness after the processing is close to the target of 130 nm for all the wafers, and the error is 0.5 nm or less as in FIG. 6B. Therefore, also in the present example, it is clear that although the variations in the structure are unknown, an accurate processing amount can be measured and the end can be determined with the high accuracy.

REFERENCE SIGN LIST

10: processing chamber
12: plasma
14: sample table
16: processing target
18: light source unit
20: introduction lens
22: emitted light
24: reflected light
26: detection lens
28: detection unit
30: film thickness or depth calculation unit
40: control unit
50: optical system
60: database selection unit
100: digital signal processing unit
102: waveform comparator
104: film thickness or depth storage unit
106: optimum film thickness or depth determiner
120: matching database calculator
122: waveform pattern database
124: optimum database determiner
D1: time-series data supplied from detection unit
D2: time-series data supplied from digital signal processing unit
D3: film thickness or depth data supplied from waveform comparator
D4: film thickness or depth data supplied from film thickness or depth storage unit

The invention claimed is:

1. A plasma processing method for processing a wafer as a processing target placed in a processing chamber inside a vacuum vessel by using plasma formed in the processing chamber, the plasma processing method comprising:

a measuring step of receiving light with a plurality of wavelengths from a surface of the wafer at a plurality of predetermined times during processing of the wafer as the processing target; and a detecting step of detecting a processing amount at one of the plurality of predetermined times during the processing of the wafer as the processing target by using a result acquired by comparing an actual data indicating intensities of the received light with the plurality of wavelengths at the one of the plurality of predetermined times during the processing of the wafer with comparative data indicating the intensities of the light with the plurality of wavelengths from surfaces of at least three of wafers which are acquired in advance, wherein the comparative data indicating the intensities of light from the surfaces of the at least three of wafers are selected from data obtained in advance indicating the intensities of the light with the plurality of wavelengths from the surface of a plurality of wafers during the processing of each of film structures on each of the plurality of wafers, and being correlated with a plurality of residual thicknesses of a target film in the film structure or time instants after the processing of the target film is started, the each of the plurality of wafers having a same type of the film structures that are made of same materials in vertical direction on the surface thereof and the comparative data being selected based on values of a similarity in each of the data indicating the intensities of the light with the plurality of wavelengths from the surfaces of the each of the plurality of wafers, and wherein in the detecting step, the processing amount at one of the plurality of predetermined times during the processing of the wafer is detected by determining the data in the comparative data having a minimum difference or deviation from the actual data indicating intensities of the received light with the plurality of wavelengths at the one of the plurality of predetermined times during the processing of the wafer.

2. The plasma processing method according to claim 1, wherein the similarity is quantified respectively in each of the plurality of wafers as a sum of differences between each value of the intensities of light in each of the plurality of the wavelengths and an average value of the intensities of the plurality of the wavelengths of the data indicating the intensities of the light with the plurality of wavelengths from the each of the plurality of wafers, the plurality of wafers including at least three wafers in which the similarities are maximum, minimum and a value equally dividing between the maximum and the minimum thereof.

3. The plasma processing method according to claim 1, wherein in plural pieces of data acquired in advance during the processing of each of the plurality of wafers and indicating the intensities of the light with the plurality of wavelengths, a difference between the intensities of the light and an average value of the intensities of the light or a squared value of the difference is used as an index indicating the similarity.

4. The plasma processing method according to claim 1, wherein a principal component value is used as an index indicating the similarity, the principal component value acquired by principal component analysis of plural pieces of data acquired in advance during the processing of each of the plurality of wafers and indicating the intensities of the light with the plurality of wavelengths.

5. The plasma processing method according to claim 1, wherein a dimensional reduction component value is used as an index indicating a similarity, the dimensional reduction component value acquired as a result of performing a dimension reduction method on plural pieces of data indicating the intensities of the light with the plurality of wavelengths acquired in advance during the processing of each of the plurality of wafers.

6. The plasma processing method according to claim 1, wherein at least one piece of data selected from plural pieces of data acquired in advance during the processing of each of the plurality of wafers and indicating the intensities of the light with the plurality of wavelengths has a predetermined similarity between the at least one piece of data and other pieces of data within a predetermined allowable range.

* * * * *